US008719549B2

(12) United States Patent
Sasao

(10) Patent No.: US 8,719,549 B2
(45) Date of Patent: May 6, 2014

(54) DEVICE TO RECONFIGURE MULTI-LEVEL LOGIC NETWORKS, METHOD TO RECONFIGURE MULTI-LEVEL LOGIC NETWORKS, DEVICE TO MODIFY LOGIC NETWORKS, AND RECONFIGURABLE MULTI-LEVEL LOGIC NETWORK

(75) Inventor: Tsutomu Sasao, Iizuka (JP)

(73) Assignee: Kyushu Institute of Technology, Kitakyushu-shi (JP)

( * ) Notice: Subject to any disclaimer, the term of this patent is extended or adjusted under 35 U.S.C. 154(b) by 862 days.

(21) Appl. No.: 12/294,763

(22) PCT Filed: Mar. 2, 2007

(86) PCT No.: PCT/JP2007/054100
§ 371 (c)(1),
(2), (4) Date: Dec. 30, 2010

(87) PCT Pub. No.: WO2007/113964
PCT Pub. Date: Oct. 11, 2007

(65) Prior Publication Data
US 2011/0153980 A1 Jun. 23, 2011

(30) Foreign Application Priority Data
Mar. 31, 2006 (JP) .................................. 2006-101107

(51) Int. Cl.
*G06F 15/00* (2006.01)
*G06F 15/76* (2006.01)

(52) U.S. Cl.
USPC ................................................ 712/15; 712/7

(58) Field of Classification Search
None
See application file for complete search history.

(56) References Cited

U.S. PATENT DOCUMENTS 6,470,485 B1 * 10/2002 Cote et al. ..................... 324/613
7,028,281 B1 * 4/2006 Agrawal et al. ................ 326/41

FOREIGN PATENT DOCUMENTS

| JP | 6-4266 | 1/1994 |
| JP | 9-297776 | 11/1997 |
| JP | 2002-297408 A1 | 10/2002 |
| JP | 2004-258799 A1 | 9/2004 |

OTHER PUBLICATIONS

Cong et al. (Combinational Logic Synthesis for LUT Based Field Programmable Gate Arrays, Apr. 1996, pp. 145-204).*
Iguchi et al. (A Method to Evaluate Logic Functions in the Presence of Unknown Inputs Using LUT Cascades, Aug. 2004, pp. 1-7).*

(Continued)

*Primary Examiner* — Robert Fennema
*Assistant Examiner* — George Giroux
(74) *Attorney, Agent, or Firm* — Kratz, Quintos & Hanson, LLP

(57) ABSTRACT

To provide a device to reconfigure multi-level logic networks, which enable logic modification and reconfiguration of a multi-level logic network with small circuit area and low-power dissipation in a simple manner. For example, in the case of reconfiguring a multi-level logic network following logic modification for deleting an output vector F(b) of an objective logic function F(X) corresponding to an input vector b, unmodified pq elements are selected one by one from the nearest pq element $E_G$ to an output side. At this time, among output values of pq elements closer to an input side than selected pq elements, output values corresponding to the input vector, which equal an output value corresponding to any input variable X other than the input vector b are considered modified and thus not selected. Then, a selected output value corresponding to the input vector b is rewritten to an "invalid value".

14 Claims, 18 Drawing Sheets

(56) References Cited

OTHER PUBLICATIONS

Tsutomu Sasao, et al.; "BDD Representation for Incompletely Specified Multiple-Output Logic Functions and Its Applications to Functional Decomposition:" Design Automation Conference; Jun. 2005; pp. 373-378./Cited at p. 2.

Hui Qin, et al.; "Implementation of LPM Address Generators on FPGAs;" Reconfigurable Computing: Architectures and Applications. Second International Workshop, ARC 2006 (Lecture Notes in Computer Science vol. 3985); Mar. 3, 2006; 12 Sheets.

Tsutomu Sasao; "Design Methods for Multiple-Valued Input Address Generators;" 36th International Symposium on Multiple-Valued Logic (ISMVL '06); May 2006; 10 Sheets.

Hiroki Nakahara, et al.; "A CAM Emulator Using Look-Up Table Cascades;" IEICE Technical Report vol. 106; No. 548 VLD2006-134; Mar. 2007; pp. 1-6.

Hiroki Nakahara, et al.; A CAM Emulator Using Look-Up Table Cascades; 14th Reconfigurable Architectures Workshop RAW 2007; Mar. 2007; RAW-9-paper-2; pp. 1-8.

International Search Report for International Application PCT/JP2007/054100 dated May 29, 2007.

* cited by examiner $$X=(X_1, X_2, ..., X_s)$$

Fig. 13
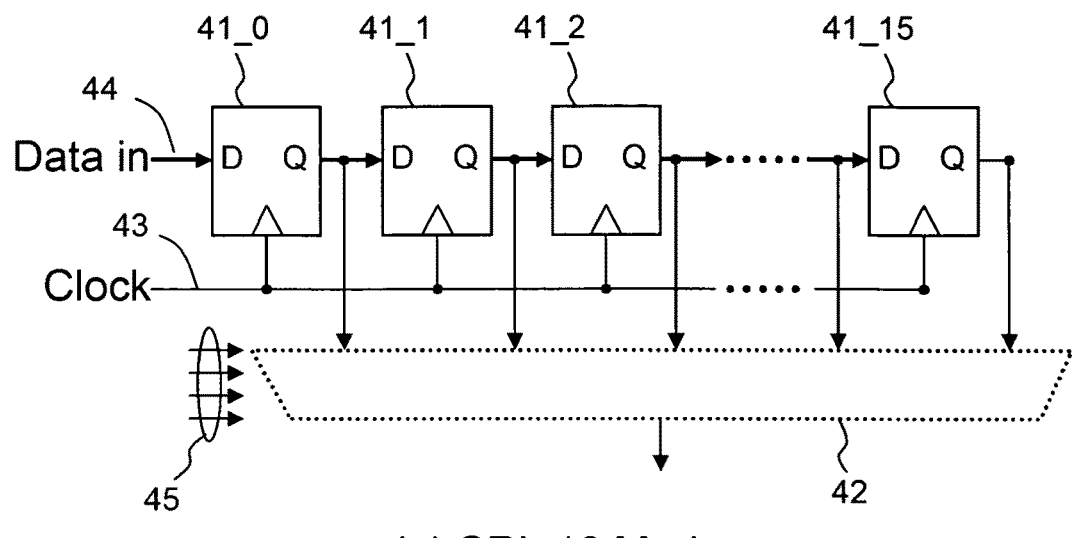
(a) SRL 16 Mode
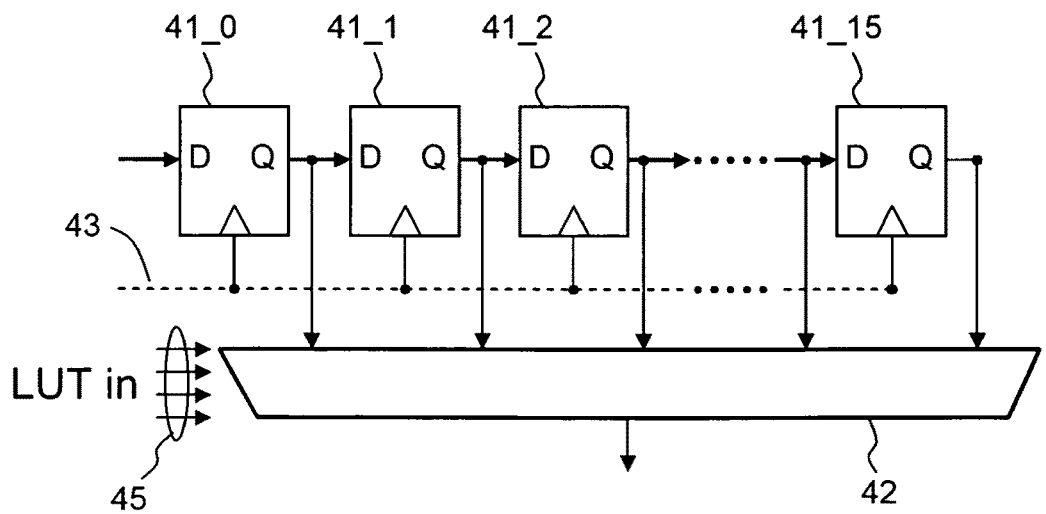
(b) 4-input LUT Mode

Fig. 16 address=rail vector # of referenced vectors
(0 denotes non-referenced)

# of registorable vectos
(# of registorable outputs)

| | |
|---|---|
| 00000000 | 1 |
| 00000001 | 3 |
| 00000010 | 2 |
| 00000011 | 1 |
| 00000100 | 4 |
| 00000101 | 0 |
| ⋮ | ⋮ |
| 11111111 | 0 |

Fig. 17 address=index for registored vector

0:non-used
1:used # of registrable vectors

| | |
|---|---|
| 00000001 | 1 |
| 00000010 | 0 |
| 00000011 | 1 |
| 00000100 | 1 |
| 00000101 | 0 |
| 00000110 | 0 |
| ⋮ | ⋮ |
| 11111111 | 0 |

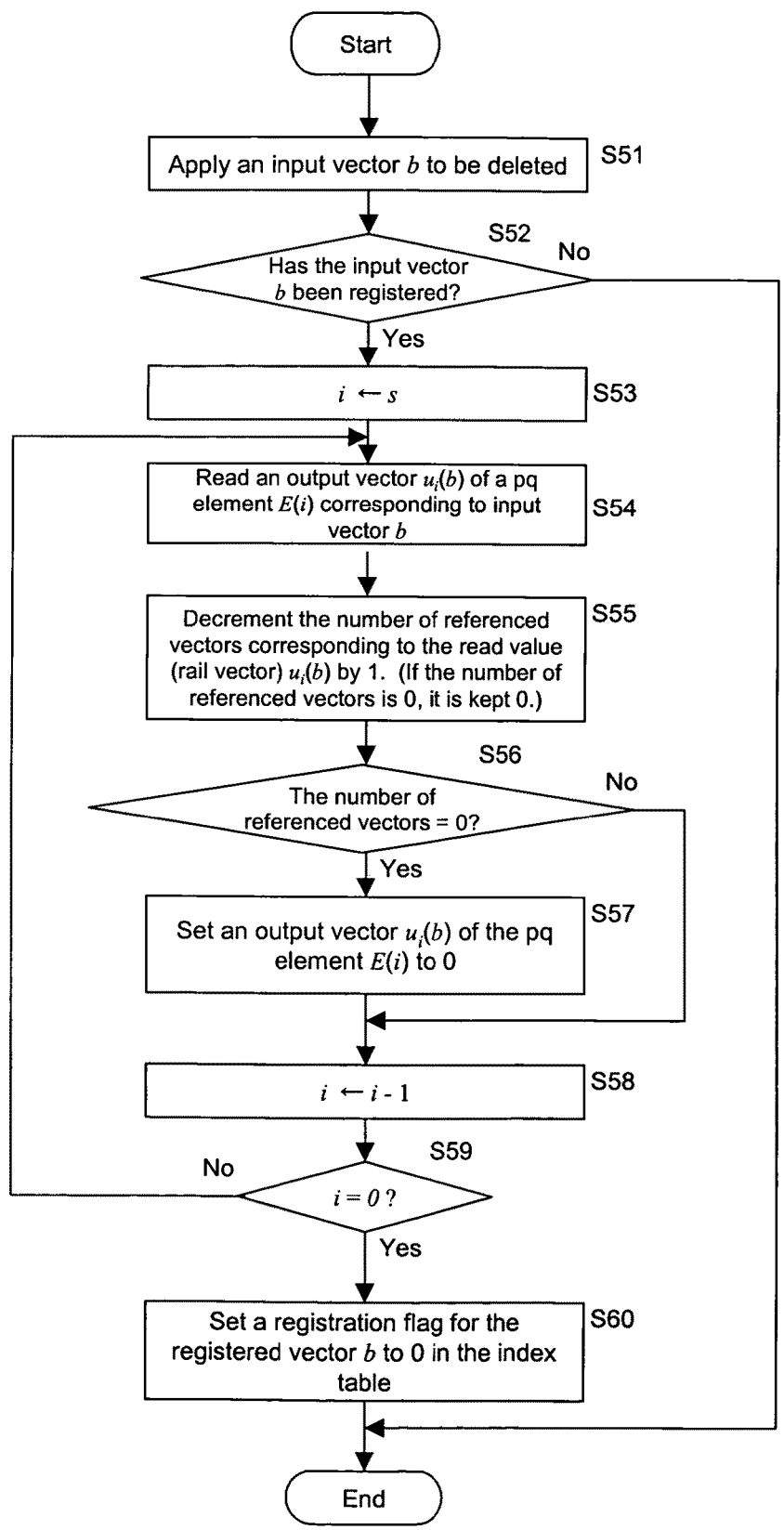

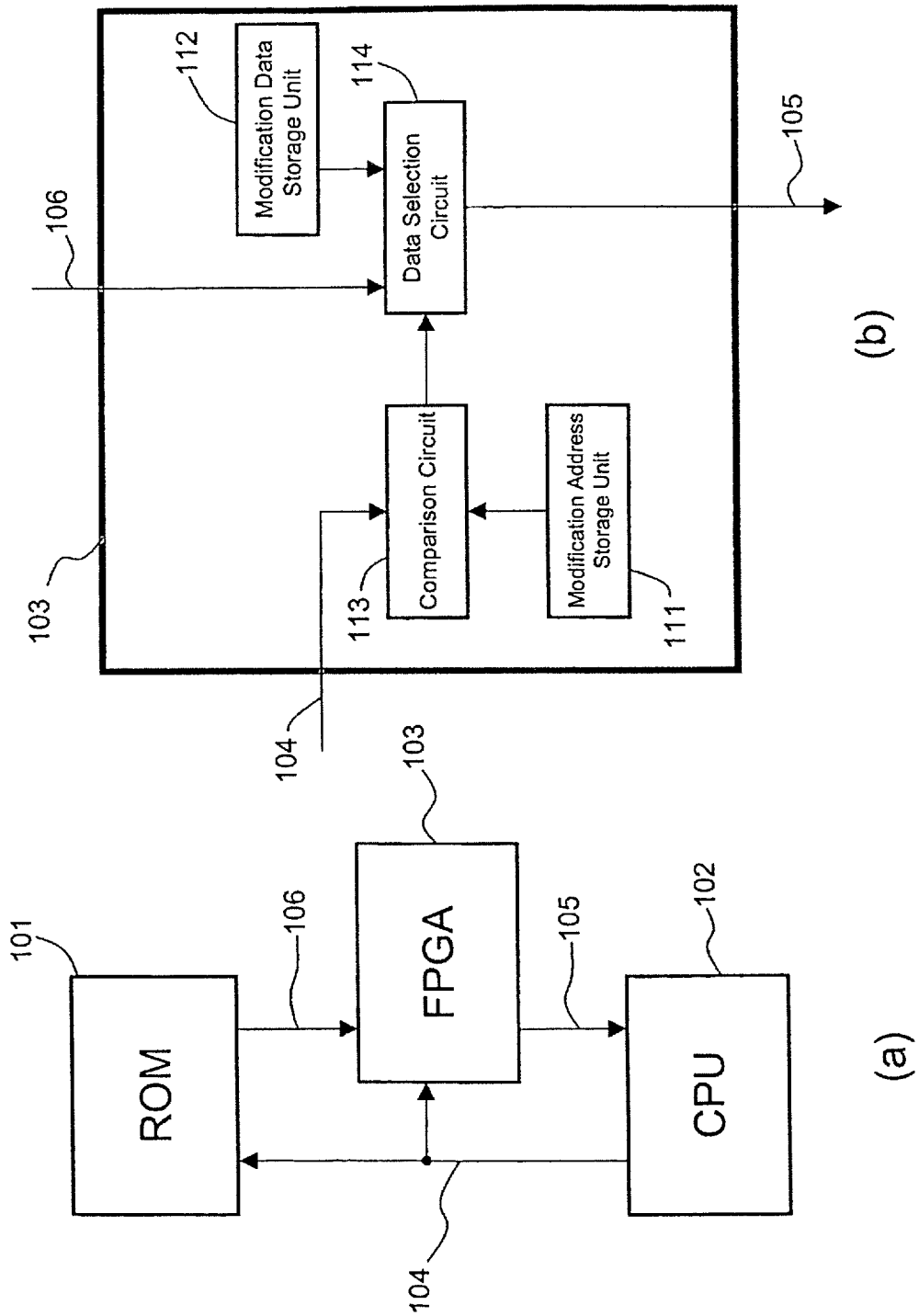

DEVICE TO RECONFIGURE MULTI-LEVEL LOGIC NETWORKS, METHOD TO RECONFIGURE MULTI-LEVEL LOGIC NETWORKS, DEVICE TO MODIFY LOGIC NETWORKS, AND RECONFIGURABLE MULTI-LEVEL LOGIC NETWORK

TECHNICAL FIELD

The present invention relates to a device to reconfigure multi-level logic networks that is logically designed through repetitive functional decomposition of any logic function, and a device to modify logic networks using the same.

BACKGROUND ART

A general logic circuit is configured using a special LSI (ASIC: Application Specific Integrated Circuit). However, a development cost for the ASIC is high, and its modification requires a lot of time and money. On the other hand, an FPGA (Field Programmable Gate Array) having simple logic configuration has been developed but is unsatisfactory in terms of power reduction and performance under present circumstances.

To that end, in general, the ASIC is designed with any extra logic circuit being previously incorporated thereinto to enable modification. This design can deal with a minor functional change flexibly to some extent.

A device disclosed in, for example, Patent Document 1 is well-known as a device to modify logic networks that undergoes a minor functional change. The device to modify logic networks discussed in Patent Document 1 is intended to modify an output value of a ROM storing a program to be executed with a CPU and is configured using the FPGA.

FIG. 20 show the configuration of a device to modify logic networks 103 described in Patent Document 1. A ROM 101 stores a program to be executed with a CPU 102. The CPU 102 sends an address to the ROM 101 through an address bus 104. The ROM 101 produces data to the address through a first data bus 106.

The device to modify logic networks 103 receives an address applied from the address bus 104 and receives corresponding data from the first data bus 106. A modification address storage unit 111 in the device to modify logic networks 103 registers an address of the ROM 101 where data to be modified is stored. A comparison circuit 113 determines whether the modification address storage unit 111 stores an address value that matches an address value applied from the address bus 104. If any address is matched, a match signal is produced; if no address is matched, a mismatch signal is produced. The match signal or mismatch signal is produced to a data selection circuit 114.

On the other hand, the modification data storage unit 112 registers data to be modified in association with each address value registered in the modification address storage unit 111. If a match signal is applied from the comparison circuit 113, the data selection circuit 114 produces data read from the modification data storage unit 112 to the second data bus 105. If a mismatch signal is applied, the data selection circuit 114 produces data applied from the first data bus 106 to the second data bus 105. The data produced to the second data bus 105 is applied to the CPU 102 as read data.

In this way, an address to be modified of the ROM 101 is registered in the modification address storage unit 111 and in addition, data to be modified is registered in the modification data storage unit 112 to thereby moderately change data in the ROM 101.

Patent Document 1: Japanese Unexamined Patent Application Publication No. 2002-297408
Patent Document 2: Japanese Unexamined Patent Application Publication No. 2004-258799
Non-Patent Document 1: T. Sasao and M. Matsuura, "BDD representation for incompletely specified multiple-output logic functions and its applications to functional decomposition", Design Automation Conference, Anaheim, Calif., Jun. 13-17, 2005, pp. 373-378.

DISCLOSURE OF INVENTION

Problems to be Solved by the Invention

In a design phase, it is uncertain which part of the original logic circuit needs to be modified. Accordingly, the device to modify logic networks needs to be able to modify an arbitrary output of the original logic circuit. For that purpose, the logic configuration of the circuit should be freely changeable.

On the other hand, the device to modify logic networks is an extra circuit not engaged in operations of the original logic circuit unless the logic circuit is modified. Thus, it is preferred to minimize the footprint and power reduction of the device to modify logic networks as much as possible.

The above conventional device to modify logic networks is configured using the FPGA with a view to expanding the versatility of the circuit. This leads to a problem that a wide wiring area is required and in addition, a relatively large chip area is required to implement the device to modify logic networks.

Further, in the case of reconfiguring the FPGA, in general, the wiring structure is changed. Accordingly, the reconfiguration should be carried out in consideration of an influence of a wiring delay etc. Moreover, in case of an erroneous change, the circuit might be broken at the worst, so the circuit change should be carefully performed. In addition, the circuit change needs to be executed while the logic circuit operation is suspended, considering the wiring change involved in the circuit change. Therefore, the FPGA is not appropriate for such an application as requires real-time dynamic change during operations of the logic circuit (for example, a change of the logic circuit configuration involved in learning with a dictionary, a neutral network, etc.).

Here, an LUT cascade logic circuit has been known as a logic circuit having reconfigurable logic configuration see Patent Document 2 and Non-Patent Document 1). In the LUT cascade logic circuit, objective logic function is decomposed into plural subfunctions that involve a serial input/output relationship through functional decomposition based on a binary decision diagram (BDD), and each subfunction is implemented as an LUT using a memory. Since the LUT cascade logic circuit is mostly configured by memories, high integration thereof is easily achieved and its footprint can be reduced.

However, reconfiguration of the LUT cascade logic circuit requires a lot of computations under conventional conditions. Upon the reconfiguration, first, a BDD of objective logic function is prepared and repeatedly subjected to partition and reconfiguration to thereby find the optimum functional decomposition method. Then, resultant subfunctions are each turned into an LUT and stored in memory. If the objective logic function involves many input variables, it is necessary to take considerable time processing the variables on a computer equipped with a large-capacity memory. Thus, the LUT cascade logic circuit has not hitherto been applied to a device to modify logic networks intended for a simple rewriting operation.

However, considering that any means enables simplified reconfiguration of the logic configuration of the LUT cascade logic circuit and minor modification of the logic configuration, if the device to modify logic networks is applied to the LUT cascade logic circuit, this application will be a promising approach to the realization of small circuit area and low-power dissipation.

In view of the above circumstances, it is an object of the present invention to provide a device to modify logic networks that can realize small circuit area and low-power dissipation compared with a conventional one by using a reconfigurable LUT logic circuit similar to the above LUT cascade logic circuit, while retaining flexibility in change of the circuit logic configuration. It is another object of the present invention to provide a device to modify logic networks that enables real-time dynamic modification during operations of a logic circuit.

It is still another object of the present invention to provide a device to reconfigure multi-level logic networks, which can reconfigure a multi-level logic network used in the above device to modify logic networks with small footprint and low power reduction in a simple manner.

It is yet still another object of the present invention to provide a reconfigurable multi-level logic network capable of minor reconfiguration of logic function and real-time dynamic reconfiguration during operations of the logic circuit.

Means for Solving the Problems

[1] Explanation of Terms and Background Principle of the Invention

To begin with, main terms used in this specification are defined, and several theoretical backgrounds of the present invention are described.

[Definition 1] (Address Generation Function and Address Generation Logic Function)

Function $F(X): B^n \rightarrow \{0,1,\ldots,k\}$ ($X$ is $n$-ary vector, $B=\{0,1\}$)

Under this condition, if $F(a_i)=i$ ($i=1, 2, \ldots, k$) with respect to k different registered vectors $a_i \in B^n$ ($i=1, 2, \ldots, k$) and $F=0$ with respect to the other ($2^n-k$) input vectors, $F(X)$ is an address generation function with a weight k. The address generation function generates 1 to k unique addresses with respect to k different binary vectors. A multi-output logic function that expresses an output value of the address generation function as a binary value is called address generation logic function".

(End of Definition)

In this specification, it is assumed that a value of k is much smaller than the total number of input-vector combinations $2^n$ ($k \ll 2^n$).

[Definition 2] (Address Detection Function)

Function $f(X): B^n \rightarrow \{0,1,\ldots,k\}$ ($X$ is $n$-ary vector)

Under this condition, if $f(a_i)=1$ ($i=1, 2, \ldots, k$) with respect to k different registered vectors $a_i \in B^n$ ($i=1, 2, \ldots, k$), and $f=0$ with respect to the other ($2^n-k$) input vectors, $f(X)$ is an address detection function with a weight k.

(End of Definition)

[Definition 3] (Address Table and Address Generation Circuit)

A table showing output vectors $F(a_i)(\in B^m)$ corresponding to k registered vectors $\{a_i | i=1, 2, \ldots, k; a_i \in B^n\}$ of address generation logic function $F(X): B^n \rightarrow \{0, 1, \ldots, k\}$ is an address table. A circuit that realizes the address table is an address generation circuit.

(End of Definition)

[Definition 4] (Partition)

An input vector is represented by $X=(x_1, x_2, \ldots, x_n)$. A set of variables of X is represented by $\{X\}$. Provided that $\{X_1\} \cup \{X_2\}=\{X\}$ and $\{X_1\} \cap \{X_2\}=\phi$, $X=(X_1, X_2)$ is partition of X where $\phi$ represents an empty set.

(End of Definition)

[Definition 5] (Decomposition Chart, Standard Decomposition Chart, and Column Multiplicity)

Assuming that completely specified function $f(X): B^n \rightarrow B^q$ ($B=\{0, 1\}, X=(x_1, x_2, \ldots, x_n)$, n, q∈natural number), $(X_L, X_H)$ is partition of X, and the dimension of X (the number of variables) is represented by $d(X)$. A table that satisfies the following conditions (1) to (3) with respect to function $f(X)$ and partition of X: $X=(X_L, X_H)$ is a decomposition chart of f.
(1) A table includes $2^{nL}$ columns×$2^{nH}$ rows.
(2) Each row and each column include a label in binary code, and the set of labels in each row and column include every conceivable pattern of $n_L$ bits and $n_H$ bits as elements.
(3) Each element in a table is a truth value f: $f(X_L, X_H)$ with respect to a combination $(X_L, X_H)$ of labels in column and row corresponding to each element.

$X_L$ is referred to as bound variables (bound variables), and $X_H$ is referred to as free variables (free variables). The number of different column patterns in a decomposition chart is referred to as column multiplicity in a decomposition chart, and represented by μ. A chart where $X_L=X$ and $X_H=\phi$ is also described as a special decomposition chart.

Further, a decomposition chart of function f, in which $X_L=(x_1, x_2, \ldots, X_{nL})$ and $X_H=(x_{nL+1}, x_{nL+2}, x_n)$ is referred to as a standard decomposition chart.

(End of Definition)

Example 1

In a decomposition chart of Table 1, $n_L=3$ and $n_H=2$. Further, the number of column patterns of the decomposition chart is 2, $(0110)^T$ and $(1101)^T$. Thus, $\mu=2$.

(End of Example)

TABLE 1

EXAMPLE OF DECOMPOSITION CHART

|  |  | $X_L$ |  |  |  |  |  |  |  |  |
|---|---|---|---|---|---|---|---|---|---|---|
|  |  | 0 | 0 | 0 | 0 | 1 | 1 | 1 | 1 | $x_3$ |
|  |  | 0 | 0 | 1 | 1 | 0 | 0 | 1 | 1 | $x_2$ |
|  |  | 0 | 1 | 0 | 1 | 0 | 1 | 0 | 1 | $x_1$ |
|  | 0 0 | 0 | 1 | 0 | 0 | 0 | 1 | 1 | 0 |  |
|  | 0 1 | 1 | 1 | 1 | 1 | 1 | 1 | 1 | 1 |  |
| $X_H$ | 1 0 | 1 | 0 | 1 | 1 | 1 | 0 | 0 | 1 |  |
|  | 1 1 | 0 | 1 | 0 | 0 | 0 | 1 | 1 | 0 |  |
|  | $x_5$ $x_4$ |  |  |  |  |  |  |  |  |  |

[Lemma 1]

The column multiplicity of a decomposition chart for an address generation (detection) function with a weight k is k+1 at most.

(End of Lemma)

[Lemma 2]

Provided that F is an address generation function, two address generation functions G and H satisfy the following expression (1), and a weight of the function F is equal to a weight of the function G.

$$F(X_1,X_2)=G(H(X_1),X_2) \qquad (1)$$

(End of Lemma)
(Proof)

Consider a decomposition chart where $X_1$ is bound variables, and $X_2$ is free variables. Also consider an address generation function H where an ordinal level of the maximum value in each column in a decomposition chart is represented by $H(X_i)$ (if the maximum value is 0, an ordinal level is set to 0). In this case, only a column including output values of 0 is contracted. Therefore, the number of output values of the function G, which are not 0 is the same as that of the function F. Further, G is also an address generation function.

(End of Proof)

Example 2

Consider a decomposition chart for a 5-variable address generation function F(X) shown in Table 2 (see FIG. 1). Assuming that the function F(X) is decomposed such that $F(X_1, X_2)=G(H(X_1), X_2)$ where $X_1=(x_1, x_2, x_3, x_4)$, $X_2=(x_5)$, the column multiplicity in Table 2 is 7. In this example, H is a 4-input/3-output function as shown in Table 3, more specifically, an address generation logic function with a weight 6. Table 4 shows a decomposition chart for a function G. As understood therefrom, the function G obtained by decomposing the address generation function F with a weight 7 is also an address generation function with a weight 7.

(End of Example)

TABLE 2

DECOMPOSITION CHART FOR FUNCTION F

| $x_1$ | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|
| $x_2$ | 0 | 0 | 0 | 0 | 1 | 1 | 1 | 1 | 0 | 0 | 0 | 0 | 1 | 1 | 1 | 1 |
| $x_3$ | 0 | 0 | 1 | 1 | 0 | 0 | 1 | 1 | 0 | 0 | 1 | 1 | 0 | 0 | 1 | 1 |
| $x_4$ | 0 | 1 | 0 | 1 | 0 | 1 | 0 | 1 | 0 | 1 | 0 | 1 | 0 | 1 | 0 | 1 |

| | | | | | | | | | | | | | | | | |
|---|---|---|---|---|---|---|---|---|---|---|---|---|---|---|---|---|
| $x_5=0$ | | 1 | | | 3 | | 4 | 5 | | | | | | | | |
| $x_5=1$ | | | 2 | | | | | 6 | | | | 7 | | | | |

TABLE 3

TRUTH TABLE FOR FUNCTION H

| $x_1$ | $x_2$ | $x_3$ | $x_4$ | $y_1$ | $y_2$ | $y_3$ |
|---|---|---|---|---|---|---|
| 0 | 0 | 0 | 0 | 0 | 0 | 0 |
| 0 | 0 | 0 | 1 | 0 | 0 | 1 |
| 0 | 0 | 1 | 0 | 0 | 1 | 0 |
| 0 | 0 | 1 | 1 | 0 | 0 | 0 |
| 0 | 1 | 0 | 0 | 0 | 1 | 1 |
| 0 | 1 | 0 | 1 | 0 | 0 | 0 |
| 0 | 1 | 1 | 0 | 1 | 0 | 0 |
| 0 | 1 | 1 | 1 | 1 | 0 | 1 |
| 1 | 0 | 0 | 0 | 0 | 0 | 0 |
| 1 | 0 | 0 | 1 | 0 | 0 | 0 |
| 1 | 0 | 1 | 0 | 0 | 0 | 0 |
| 1 | 0 | 1 | 1 | 0 | 0 | 0 |
| 1 | 1 | 0 | 0 | 1 | 1 | 0 |
| 1 | 1 | 0 | 1 | 0 | 0 | 0 |
| 1 | 1 | 1 | 0 | 0 | 0 | 0 |
| 1 | 1 | 1 | 1 | 0 | 0 | 0 |

TABLE 4

DECOMPOSITION CHART FOR FUNCTION G

| $y_1$ | 0 | 0 | 0 | 0 | 1 | 1 | 1 | 1 |
|---|---|---|---|---|---|---|---|---|
| $y_2$ | 0 | 0 | 1 | 1 | 0 | 0 | 1 | 1 |
| $y_3$ | 0 | 1 | 0 | 1 | 0 | 1 | 0 | 1 |

| | | | | | | | | |
|---|---|---|---|---|---|---|---|---|
| $x_5=0$ | | 1 | | 3 | 4 | 5 | | |
| $x_5=1$ | | | 2 | | | 6 | 7 | |

[Lemma 3]

Provided that f is an address detection function, an address detection function g and an address generation function H satisfy the following expression (2), and a weight of the function g is lower than a weight of the function f.

$$f(X_1,X_2)=g(H(X_1),X_2) \qquad (2)$$

(End of Lemma)

This can be proved similar to Lemma 2. Since an output of an address detection function is a single output, a circuit using the address detection function is simpler than a corresponding address generation circuit.

[Definition 6] (pq Element)

A pq element refers to a memory realizing an arbitrary p-input/q-output logic function, and its memory size is $2^p q$.

(End of Definition)

[Theorem 1]

An address generation logic function with a weight k can be composed using pq elements in a number corresponding to the number derived from the following expression (3).

$$\left\lceil \frac{n-q}{p-q} \right\rceil. \text{ (WHERE, } p > q, q = \lceil \log_2(k+1) \rceil) \qquad (3)$$

(End of Theorem)
(Proof)

An address generation logic function F with a weight k can be subjected to functional decomposition as expressed by the following expression (4).

$$F(X_1,X_2)=G(H(X_1),X_2) \qquad (4)$$

In this example, $G(X1^{**}, X2)$ is also an address generation function with a weight k as will be understood from Lemma 1, and the number of inputs is reduced to n−(p−q). This operation is repeated plural times corresponding to the number calculated as follows:

$$\left\lceil \frac{n-q}{p-q} \right\rceil \text{ TIMES} \qquad (5)$$

As a result, the number of inputs can be reduced down to q. Accordingly, an address generation circuit can be configured only using pq elements.

(End of Proof)

Example 3

The number of non-zero output values of the 5-variable address generation function F(X) in Table 2 is 7 (k=7). Thus, the following expression (6) is established, and as shown in FIG. 1, the circuit can be realized using 4-input/3-output elements.

$$q = \lceil \log_2(k+1) \rceil = \lceil \log_2(7+1) \rceil = 3 \quad (6)$$

(End of Example)

Upon circuit synthesis with pq elements, if p is set large, the number of pq elements necessary to realize the circuit is reduced but the total memory size is increased. On the other hand, if p is set small, the total memory size is reduced but the number of pq elements increases.

Consider that an address generation circuit is synthesized using pq elements. In this case, a method of determining p, which can minimize the number of elements without increasing the total memory size, is given by the following theorem.
[Theorem 2]

In the case of implementing an address generation logic function as a multi-level logic network using pq elements, an upper limit for the total memory size is lowest if p−q=1 or p−q=2.
(End of Theorem)
(Proof)

Upon the functional decomposition of an address generation circuit using pq elements, the number of input lines of the circuit can be reduced by r=p−q at each decomposition. To reduce n input lines down to q lines, functional decomposition should be repeated plural times corresponding to the number calculated as follows:

$$s = \left\lceil \frac{n-q}{r} \right\rceil \text{TIMES} \quad (7)$$

Further, s pq elements are necessary to realize the circuit. Thus, the requisite total memory size is as follows:

$$MEM = s \cdot 2^p q \quad (8)$$

If n is large enough, the memory size can be approximated as follows:

$$MEM \approx \left( \frac{2^r}{r} \right) \cdot (n-q) \cdot 2^q q \quad (9)$$

Since n and p are fixed under the above provision, only r is variable. If r=1 or r=2, $2^r/r$ takes the maximum value. Thus, the above theorem is proved.
(End of Proof)

In general, the number of levels of the circuit is desirably small, the circuit is configured under the condition of r=p−q=2. Theorem 1 indicates that an address generation circuit can be synthesized as a multi-level logic network using pq elements by repeating functional decomposition. The following Example 3 shows that various multi-level logic networks including an LUT cascade logic circuit can be synthesized according to functional decomposition.

Example 4

An address generation circuit with the number of inputs n=48 and a weight k=255 is configured.

$$q = \lceil \log_2(255+1) \rceil = 8 \quad (10)$$

The above relationship is established. Thus, a value of p, which can minimize the memory size and reduce the number of circuit levels, is 10 (p=10). Since the number of input lines is decremented by 2 per pq element, if 20 pq elements are used, the number of inputs can be reduced down to 8. An address generation circuit as shown in FIG. 2 can be achieved using 20 pq elements, for example. In this case, the number of circuit levels is 10, and the memory size is 160 kbit.

Further, if an element having a large number of inputs is used, the number of elements and delay time can be reduced. In an illustrated example of FIG. 3, p=11 and q=8. In this case, the number of elements is (48−8)/(11−8)=14, the number of circuit levels is 8, and the memory size is 212 kbit. In an illustrated example of FIG. 4, p=12 and q=8. In this case, the number of elements is (48−8)/(12−8)=10, the number of circuit levels is 5, and the memory size is 320 kbit.
(End of Example)

Theorem 2 indicates a condition for setting an upper limit for the total memory size to the lowest value upon the implementation of a general address generation function. The total memory size is minimized with a particular address generation function even if a relationship of p−q=2 is not satisfied.

Next, described is a method of multi-level logic reconfiguration for reconfiguring a multi-level logic network using pq elements with varying address tables for an address generation function. The modification of the multi-level logic network can be divided into two basic operations:
(1) deletion of registered vector
(2) addition of registered vector
Thus, the above operations (1) and (2) are considered below.

Further, as described above, the multi-level logic network using pq elements is configuring through repeated functional decomposition of an objective logic function F. Thus, it is only necessary to describe how to modify a function H and a function G under the condition that functional-decomposed function $F(X_1, X_2)=G(H(X_1), X_2)$ in the case where an address table for the objective logic function F is changed.

In the following description, "input variable" and "output variable" refer to undetermined values, and "input vector" and "output vector" refer to a specific value of an input variable and a specific value of an output variable.
(1) Deletion of Registered Vector Assume that partition of an input variable X (∈B") is expressed by $X=(X_1, X_2)$, functional decomposition of an address generation function F(X) is expressed by $F(X_1, X_2)=G(H(X_1), X_2)$, a vector a (∈B") is a registered vector of an address generation function F(X), and partition of the vector a corresponding to the partition of the input variable: $X=(X_1, X_2)$ is expressed by $a=(a_1, a_2)$.

Consider the case of deleting the registered vector from the address table for the address generation function F(X). The following description is made on the assumption that the address table is achieved using an LUT cascade logic circuit.

In the case of deleting the vector a from the address table, F(a)=0. Thus, $G(H(a_1), a_2)=0$.

On the other hand, provided that one of two variables, variable $Y_1$, of a subfunction $G(Y_1, X_2)$ is set as a fixed value $H(a_1)$, and a variable $X_2$ is changed, if a relationship of $G(H(a_1), X_2) \neq 0$ is not satisfied with no variables $X_2$ but $X_2=a_2$, output vectors corresponding to registered vectors other than the vector a in the original address table do not depend on a value of subfunction $H(a_1)$. Accordingly, in this case, $H(a_1)$ is an "invalid value" and thus may be 0 ($H(a_1)=0$).

As understood from the above, the modification of the LUT cascade logic circuit following the deletion of the registered vector a from the address table can be performed based on the following algorithm.
(Algorithm 1)

(Step 1) Among unmodified pq elements, an element nearest to an output side is selected. The selected pq element is represented by $E_G$. A subfunction expressed by the pq element $E_G$ is $G(H(X_1), X_2)$ where $(X_1, X_2) \subset X$ and $X_1 \cap X_2 = \phi$. An input vector for $(X_1, X_2)$ is $(a_1, a_2)$. If the pq element $E_G$ is furthest from an output side, $X_1 = \phi$ and $H(X_1) = \phi$.

(Step 2) Among output vectors of an LUT stored in the pq element $E_G$, an output vector corresponding to the input vector $(H(a_1), a_2)$ is referred to as $G(H(a_1), a_2) = 0$. The pq element $E_G$ is assumed modified.

(Step 3) It is checked whether any input vector $a_o$ corresponding to a partial variable $X_2$ where an output vector $G(H(a_1), X_2)$ is non-zero, exists.

(Step 4) if $a_o$ does not exist, the processing returns to Step 1; otherwise, the processing is terminated.

(End of Algorithm)

The above algorithm can be easily applied to a general pq element multi-level logic function. The algorithm applied to the general pq element multi-level logic function is as follows.

(Algorithm 2)

(Step 1) A pq-circuit network having s elements can be configured through (s−1) functional decomposition operations. Upon each functional decomposition, pq elements are extracted one by one from an input side and numbered 1 to s. A pq element on the output side is numbered s. The element $E_1$ numbered 1 is furthest from the output side.

(Step 2) A set of pq elements is represented by p, and an initial value $p = \{E_s\}$.

(Step 3) In a multi-level logic network, functional-decomposed function $G(H_1(Y_1), H_2(Y_2), \ldots, H_m(Y_m))$ of the circuit configured using a p-element and the other elements is considered. In this example, $Y_i$ is an intermediate variable, and the case where $H_k(Y_k) = Y_k$ is also considered as a special case.

(Step 4) Assuming that $G(H_1(a_1), H_2(a_2), \ldots, H_2(a_2)) = 0$ where a $(=(a_1, a_2, \ldots, a_m))$ is an intermediate variable vector, and $H_i(a_i) = d \neq 0$, if a relationship of $H_i(a_i) = d$ is not established with respect to the other registered vectors b, $H_i(a_i) = 0$.

(Step 5) If the number of elements in the set p of pq elements is s−1", the processing is terminated; otherwise, an element assigned the highest number is added to the set p and the processing returns to Step 3.

(End of Algorithm)

(2) Addition of Registered Vector

Next, the case of adding a registered vector a to an address table for an address generation function F(X) is considered. An output vector corresponding to the additional registered vector a is represented by c. The following description is focused on the case where an address table is generated using an LUT cascade logic circuit.

In the case of adding the vector a to the address table, $F(a) = c$. Thus, $G(H(a_1), a_2) = c$.

In this example, the registered vector a can correspond one-to-one with a value of F(a) as long as a value of a subfunction $H(a_1)$ is not 0. To that end, if an output vector of the subfunction $H(a_1)$ is 0, the vector should be corrected to any value other than 0. In this case, the correction should be performed not to influence an output value of the other registered vectors, so an output vector of the subfunction $H(a_1)$ is changed to an unused value. For example, the smallest one can be selected from among unused values larger than the maximum value of non-zero output values of the subfunction $H(X_1)$.

As will be understood from the above, the modification of the LUT cascade logic circuit following the addition of the registered vector a to the address table can be performed according to the following algorithm.

(Algorithm 3)

(Step 1) Among unmodified pq elements, an element furthest from an output side is selected. The selected pq element is represented by $E_G$. A subfunction of the pq element $E_G$ is $G(H(X_1), X_2)$ where $(X_1, X_2) \subset X$ and $X_1 \cap X_2 = \phi$. An input vector corresponding to $(X_1, \overline{X_2})$ is referred to as $(a_1, a_2)$. Here, if the pq element $E_G$ is furthest from an output side, $X_1 = \phi$, $H(X_1) = \phi$.

(Step 2) Provided that $e_0 = G(H(a_1), a_2)$, if the pq element $E_G$ is nearest to an output side, $e = c$; otherwise, if $e_0 \neq 0$, $e = e_0$, and if $e_0 = 0$, e is set to the smallest one out of positive unused output values among conceivable output values of the pq element $E_G$.

(Step 3) Among output vectors of an LUT stored in the pq element $E_G$, an output vector corresponding to an input vector $(H(a_1), a_2)$ is $\{G(H(a_1), a_2) = e\}$.

(Step 4) If any unmodified pq element is found, the processing returns to Step 1; otherwise, the processing is terminated.

(End of Algorithm)

The above algorithm can be easily applied to a general pq element multi-level logic function. The algorithm applied to the general pq element multi-level logic function is described below.

(Algorithm 4)

(Step 1) A pq-circuit network having s elements can be configured through (s−1) functional decomposition operations. Upon each functional decomposition, pq elements are extracted one by one from an input side and numbered 1 to r. A pq element on the output side is numbered s. The element $E_1$ numbered 1 is furthest from the output side. An input vector corresponding to an input variable X is a. The pq element $E_1$ numbered 1 is $E_G$.

(Step 2) The input vector a is applied to the multi-level logic network. In this case, an output vector of the element $E_G$ is $e_0$.

(Step 3) Provided that the pq element $E_G$ is nearest to an output side, $e = c$; otherwise, if $e_0 \neq 0$, $e = e_0$, and if $e_0 = 0$, e is set to the smallest one of positive unused output values among conceivable output values of the pq element $E_G$.

(Step 4) An output vector corresponding to the input vector a among output vectors of an LUT stored in the pq element $E_G$ is e.

(Step 5) If $E_G$ is a pq element nearest to an output side, the processing is terminated; otherwise, a pq element ranked next to the element $E_G$ in Step 1 in is set as $E_G$ and the processing returns to Step 2.

(End of Algorithm)

The deletion of the registered vector and the addition of the registered vector are performed as above to enable reconfiguration of a pq-element-equipped multi-level logic network in the case of changing an address table for an address generation function. If the pq-element-equipped multi-level logic network is an LUT cascade circuit, an address can be added to or deleted from an address table within a time proportional to the number of cells and the number of registered vectors (addresses).

[2] Construction and Operation of the Invention

According to a first constitution of a device to reconfigure multi-level logic networks of the present invention, a device to reconfigure multi-level logic networks, wherein plural pq elements storing LUTs of subfunctions obtained by the functional decomposition of the objective logic function F(X) with the input variables X, are connected to form a network according to the connection relation among the inputs and outputs of the subfunctions, due to the logic modification that modifies the output vector F(b) of the objective logic function F(x) for the input vector b to "invalid value", comprising:

means to select element that selects pq elements one-by-one from the pq element $E_G$ that is in the nearest place to the output terminal, among the unmodified the pq elements;

means to check correspondence that checks whether the input vector corresponding to the output vector c exists other than the input vector b, where c denotes the output vector for the input vector b among the output vectors of LUTs of the pq element $E_G$;

and means to modify by deleting a vector that changes the state of the pq element $E_G$ as modified, and to rewrite the output vector c for the input vector b to "invalid value", when the input vector b is the only vector that produces the output vector c in the LUTs of the pq element $E_G$ According to this constitution, (1) first, means to select element selects a pq element one-by-one from the nearest pq element $E_G$ to the output side among the unmodified pq elements, (2) next, means to check correspondence checks whether the input vector b corresponds to the output vector c for the input vector b of the pq element $E_G$ one to one, and (3) subsequently, means to modify by deleting a vector rewrites an output value for the input vector b as invalid" value and assigns the pq element $E_G$ as modified element in case that the input vector b corresponds to the output vector c one to one in the LUTs of the pq element $E_G$.

The above processes (1) to (3) are repeated to thereby perform logic modification for changing the output vector F(b) for the input vector b to an "invalid value" in the pq-element-equipped multi-level logic network as described in Algorithm 1 or 2 above.

Here, the term "multi-level logic network" means a logic circuit configured by plural cascade- or tree-connected pq elements, inclusive of an LUT cascade logic circuit. The term "invalid value" means a value indicating that the output vector F(b) is invalid. The "invalid value" is generally 0 but is not limited to 0.

According to a second constitution of a device to reconfigure multi-level networks of the present invention, a device to reconfigure multi-level networks, wherein plural pq elements storing LUTs of subfunctions obtained by functional decomposition of the objective logic function F(X) with the input variables X, are connected to form a network according to the connection relation among the inputs and outputs of the subfunctions, due to the logic modification such that the output vector a for the input vector b is appended to the set of the output vectors of the objective logic function F(X), comprising:

means to select element that selects pq elements one-by-one from the pq element $E_G$ that is in the furthest place from the output terminal, among the unmodified the pq elements;

means for association that changes the state of the pq element $E_G$ as modified, when the pq element $E_G$ is not in the nearest place to the output terminal, and that changes the output vector c to the vector value not used as an output vector of the pq element, when the output vector c for the input vector b is "invalid value" among the output vectors of LUTs of the pq element $E_G$;

and means to modify by adding a vector that rewrites the output vector c for the input vector b of LUTs of the pq element $E_G$ into the output vector a, and that changes the state of the pq element $E_G$ as modified, when the pq element $E_G$ is in the nearest place to the output terminal.

According to this constitution, (1) first, means to select element selects a pq element one-by-one from the furthest pq element $E_G$ from the output side among the unmodified pq elements, (2) next, means for association assigns the pq element $E_G$ as modified element in case that the pq element $E_G$ selected by means to select element is not the nearest to the output side, and changes the output vector c to the vector value not used as an output vector of the pq element in case that output vector c for the input vector b is invalid" value among output vectors of LUTs of the pq element $E_G$, and (3) subsequently, means to modify by adding a vector rewrites the output vector c for the input vector b of the output vectors of LUTs of the pq element $E_G$ in output vector a, and assigns the pq element $E_G$ as modified element, in case that the pq element $E_G$ selected by means to select element is the nearest to the output side.

The above processes (1) to (3) are repeated to thereby perform logic modification for adding the output vector a for the input vector b in a pq-element-equipped multi-level logic network as described in Algorithm 3 or 4 above.

According to a first constitution of a device to modify logic networks of the present invention, a device to modify logic networks, wherein the output vector $Q(b_i)$ of the main logic network for a specific object input vector $b_i$ is modified to modification output vector $Q'(b_i)$, where $b_i$ is an input vector among the input vectors b applied to the input variables X, and the main logic network implements the objective logic function Q(X) of the input variable X, comprising:

an auxiliary memory that stores the vector for modification $P_i$ in the prescribed address $A_i$, to modify the output vector $Q(b_i)$ into the modification output vector $Q'(b_i)$ for the object input vector means to modify that produces the modification output vector $Q'(b_i)$, according to the vector for modification $P_i$ and the output vector $Q(b_i)$ produced by the main logic network, when the auxiliary memory produces the vector for modification $P_i$;

and an address generation circuit that realizes the address generation function F(X), where F(X) produces the address $A_i$ for the auxiliary memory that stores the vector for modification $P_i$, when the value of the input variable X equals to the object input vector $b_i$;

and wherein the address generation circuit is composed of the multi-level logic networks, where plural pq elements that store LUTs of subfunctions obtained by a functional decomposition of the address generation function F(X), are connected to form a network according to connection relation among the inputs and outputs of the subfunctions;

and the auxiliary memory that produces the vector for modification $P_i$ to means to modify, when the address $A_i$ produced by the address generation circuit is applied.

According to this constitution, if the input vector b is applied to the main logic circuit as an input variable X, the main logic circuit operates the objective logic function to produce the output vector Q(b). On the other hand, the address generation circuit operates the address generation function F(b) for the input vector b. If the input vector b is an object input vector $b_i$, the address generation circuit produces the address $A_i$. The address $A_i$ is applied to the auxiliary memory. The auxiliary memory produces the vector for modification $P_i$ to the address $A_i$. Then, means to modify outputs the modification output vector $Q'(b_i)$ on the basis of the vector for modification $P_i$ and the output vector $Q(b_i)$. As a result, an output value of the objective logic function is changed. If the input vector b is not the object input vector $b_i$, the address generation circuit does not produce the address $A_i$ and thus, the auxiliary memory does not produce the vector for modification $P_i$. Accordingly, the output vector $Q(b_i)$ is produced as it is without being modified by means to modify.

According to the present invention, a pq-element-equipped multi-level logic network is used as the address generation circuit, so the address generation circuit can be achieved with a small memory capacity as described above. Accordingly, power as well as footprint of the device to modify logic networks can be reduced. Further, logic modification of the address generation circuit can be executed on the basis of above Algorithm 1 or 2 and Algorithm 3 or 4, and if necessary, an output of the main logic circuit can be freely adjusted.

In addition, in the device to modify logic networks according to the present invention, the address generation circuit can be reconfigured only by rewriting a pq element (memory) without changing a line path. Thus, the address generation circuit can be easily modified without considering an influence of wiring delay etc. Moreover, since the modification can be performed without requiring any line change, the circuit can be dynamically modified in real time during operations of the main logic circuit.

According to a second constitution of a device to modify logic networks of the present invention, in the device to modify logic networks according to the first constitution, the exclusive OR of the vector for modification $P_i$ and the output vector $Q(b_i)$ of the main logic network for the object input vector $b_i$, is equal to the modification output vector $Q'(b_i)$;

the auxiliary memory that produces the vector for modification $P_i$ when the input is the address $A_i$ produced by the address generation circuit, and that produces zero for other cases;

and means to modify is the EXOR gates performing the exclusive OR operations between the outputs of the auxiliary memory and the outputs of the main logic network.

According to a third constitution of a device to modify logic networks of the present invention, in the device to modify logic networks according to the first constitution, means to modify is the tri-state buffers connected in the output stage of the main logic network and the auxiliary memory;

the address generation circuit that produces "invalid value" for the input variable X, when the value of the input variable X is different from any of the object input vector $b_i$;

the tri-state buffer in the output stage of the main logic network is in the high impedance state when the output value of the address generation circuit is not "invalid value", and otherwise in the low impedance state;

and the tri-state buffer in the output stage of the auxiliary memory is in the high impedance state when the output value of the address generation circuit is "invalid value", and otherwise in the low impedance state.

According to a fourth constitution of a device to modify logic network of the present invention, in the device to modify logic network according to any one of the first to third constitutions, the auxiliary memory is the pq element in the final stage of the address generation circuit. Here, it is assumed that the number of outputs of an element in the final stage may be q or more.

According to a fifth constitution of a device to modify logic networks of the present invention, the device to modify logic networks according to any one of the first to fourth constitutions further comprises:

a reconfiguration device to reconfigure the address generation circuit, due to the logic modification that modifies the output vector F(b) of the address generation function F(X) for the input vector b into "invalid value" in the address generation circuit;

wherein the reconfiguration device comprising:

means to select element that selects pq elements one-by-one from the pq element $E_G$ that is in the nearest place to the output terminal, among the unmodified the pq elements;

means to check correspondence that checks whether the input vector corresponding to the output vector c exists other than the input vector b, where c denotes the output vector for the input vector b, among the output vectors of LUTs of the pq element $E_G$;

and means to modify by deleting a vector that changes the state of the pq element $E_G$ as modified, and that rewrite the output vector c for the input vector b to "invalid value", when the input vector b is the only vector that produces the output vector c in the LUTs of the pq element $E_G$.

According to a sixth constitution of a device to modify logic networks of the present invention, the device to modify logic networks according to any one of the first to fourth constitutions further comprises:

a reconfiguration device to reconfigure the address generation circuit, due to the logic modification such that the output vector a for the input vector b is appended to the set of the output vectors of the objective logic function F(X) in the address generation circuit; wherein the reconfiguration device comprising:

means to select element that selects pq elements one-by-one from the pq element $E_G$ that is in the furthest place from the output terminal, among the unmodified the pq elements;

means for association that changes the state of the pq element $E_G$ as modified, when the pq element $E_G$ is not in the nearest place to the output terminal, and that changes the output vector c to the vector value not used as an output vector of the pq element, when the output vector c for the input vector b is "invalid value" among the output vectors of LUTs of the pq element $E_G$;

and means to modify by adding a vector that rewrites the output vector c for the input vector b of LUTs of the pq element $E_G$ into the output vector a, and that changes the state of the pq element $E_G$ as modified, when the pq element $E_G$ is in the nearest place to the output terminal.

According to a first constitution of method to reconfigure multi-level logic networks of the present invention, a method to reconfigure multi-level logic networks, wherein plural pq elements storing LUTs of subfunctions obtained by the functional decomposition of the objective logic function F(X) with the input variables X, are connected to form a network according to the connection relation among the inputs and outputs of the subfunctions, due to the logic modification that modifies the output vector F(b) of the objective logic function F(X) for the input vector b into "invalid value", comprising the steps of:

a selecting element step that selects pq elements one-by-one from the pq element $E_G$ that is in the nearest place to the output terminal, among the unmodified the pq elements;

a checking correspondence step that checks whether the input vector corresponding to the output vector c exists other than the input vector b, where c denotes the output vector for the input vector b, among the output vectors of LUTs of the pq element $E_G$;

and a modifying by deleting a vector step that changes the state of the pq element $E_G$ as modified, and that rewrite the output vector c for the input vector b to "invalid value", when the input vector b is the only vector that produces the output vector c in the LUTs of the pq element $E_G$;

and above steps are executed repeatedly.

According to a second constitution of a method to reconfigure multi-level logic networks of the present invention, a method to reconfigure multi-level logic networks, wherein plural pq elements storing LUTs of subfunctions obtained by functional decomposition of the objective logic function F(X) with the input variables X, are connected to form a network according to the connection relation among the inputs and outputs of the subfunctions, due to the logic modification such that the output vector a for the input vector b is appended to the set of the output vectors of the objective logic function F(X), comprising the steps of:

a selecting element step that selects pq elements one-by-one from the pq element $E_G$ that is in the furthest place from the output terminal, among the unmodified the pq elements;

an associating step that changes the state of the pq element $E_G$ as modified, when the pq element $E_G$ is not in the nearest place to the output terminal, and that changes the output vector c to the vector value not used as an output vector of the pq element, when the output vector c for the input vector b is "invalid value" among the output vectors of LUTs of the pq element $E_G$;

and a modifying by adding a vector step that rewrites the output vector c for the input vector b of LUTs of the pq element $E_G$ into the output vector a, and that changes the state of the pq element $E_G$ as modified, when the pq element $E_G$ is in the nearest place to the output terminal;

and above steps are executed repeatedly.

According to a first constitution of a reconfigurable multi-level logic network of the present invention, a reconfigurable multi-level logic network wherein plural pq elements storing LUTs of subfunctions obtained by the functional decomposition of the objective logic function F(X) with the input variables X, are connected to form a network according to the connection relation among the inputs and outputs of the subfunctions, comprising:

a reconfiguration circuit that modifies the multi-level logic networks, due to the logic modification that modifies the output vector F(b) of the objective logic function F(X) for the input vector b into "invalid value";

wherein the reconfiguration circuit comprising:

means to select element that selects pq elements one-by-one from the pq element $E_G$ that is in the nearest place to the output terminal, among the unmodified the pq elements;

means to check correspondence that checks whether the input vector corresponding to the output vector c exists other than the input vector b, where c denotes the output vector for the input vector b, among the output vectors of LUTs of the pq element $E_G$;

and means to modify by deleting a vector that changes the state of the pq element $E_G$ as modified, and to rewrite the output vector c for the input vector b to "invalid value", when the input vector b is the only vector that produces the output vector c in the LUTs of the pq element $E_G$.

With this constitution, as described above, the reconfiguration circuit can easily delete the output vector F(b) of the objective logic function F(X) only by rewriting a pq element (memory). Further, since the deletion can be performed without requiring any line change, the circuit can be dynamically modified in real time during operations of the logic circuit.

According to a first constitution of a reconfigurable multi-level logic network of the present invention, a reconfigurable multi-level logic network wherein plural pq elements storing LUTs of subfunctions obtained by functional decomposition of the objective logic function F(X) with the input variables X, are connected to form a network according to the connection relation among the inputs and outputs of the subfunctions, comprising:

a reconfiguration circuit that performs reconfiguration of the multi-level logic networks, due to the logic modification such that the output vector a for the input vector b is appended to the set of the output vectors of the objective logic function F(X);

wherein the reconfiguration circuit comprising:

means to select element that selects pq elements one-by-one from the pq element $E_G$ that is in the furthest place from the output terminal, among the unmodified the pq elements;

means for association that changes the state of the pq element $E_G$ as modified, when the pq element $E_G$ is not in the nearest place to the output terminal, and that changes the output vector c to the vector value not used as an output vector of the pq element, when the output vector c for the input vector b is "invalid value" among the output vectors of LUTs of the pq element $E_G$;

and means to modify by adding a vector that rewrites the output vector c for the input vector b of LUTs of the pq element $E_G$ into the output vector a, and that changes the state of the pq element $E_G$ as modified, when the pq element $E_G$ is in the nearest place to the output terminal.

With this constitution, as described above, the reconfiguration circuit can easily perform logic modification for adding the output vector a for the input vector b to the output vector set of the objective logic function F(X) only by rewriting a pq element (memory). Further, since the addition can be performed without requiring any line change, the circuit can be dynamically modified in real time during operations of the logic circuit.

Advantages of the Invention

As described above, according to the device to reconfigure multi-level logic networks of the present invention, the reconfiguration of the multi-level logic network configured by pq elements following its logic modification can be performed in a short time. In addition, the reconfiguration processing can be performed in a short time with a small computation amount, and a small memory capacity suffices for reconfiguration calculation. Thus, the circuit can be imbedded into a chip as a dedicated circuit.

Further, according to the device to modify logic networks of the present invention, a pq-element-equipped multi-level logic network is used as the address generation circuit. Thus, as described above, the address generation circuit can be realized with a small memory capacity. Hence, power as well as footprint of the device to modify logic networks can be reduced. In addition, logic modification of the address generation circuit can be executed, and if necessary, an output of the main logic circuit can be freely adjusted.

BRIEF DESCRIPTION OF DRAWINGS

FIG. 13 show a 4-input LUT used in the Xilinx FPGA;

FIG. 16 shows an example of A reference table 9;

FIG. 17 shows an example of an index table;

FIG. 19 is a flowchart of registered vector deletion processing in a reconfigurable multi-level logic network of the fourth embodiment; and FIG. 20 show the configuration of a device to modify logic networks 103 disclosed in Patent Document 1.

Figure 1:
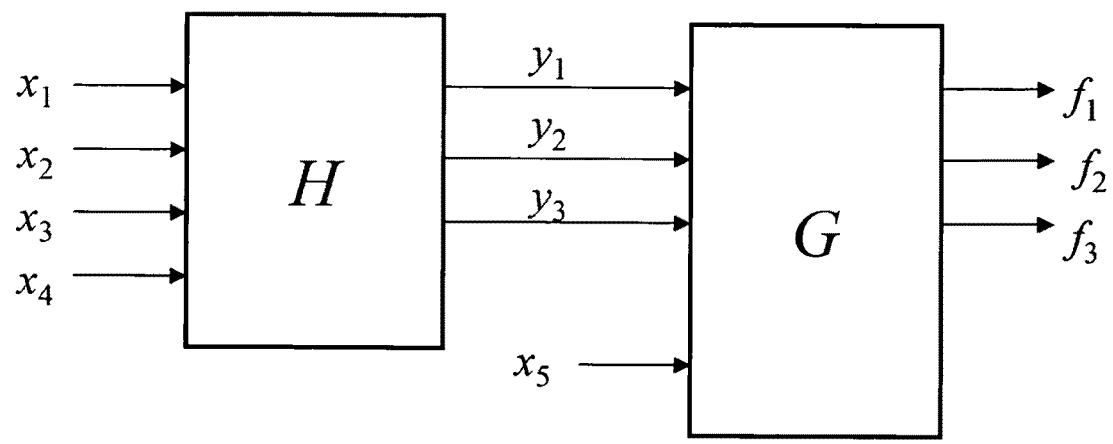
FIG. 1 shows functional decomposition of an address generation logic function F.

DESCRIPTION OF REFERENCE NUMERALS 1, 1': reconfigurable circuit
2: means to select element
3: means to select element
4: means to check correspondence
5: means to modify by deleting a vector
6: means for association
7: means to modify by adding a vector
8: index table
9: reference table
10: multi-level logic network
11: input data bus
12: output data bus
13: pq element
20: device to modify logic networks
21: address generation circuit
22: auxiliary memory
23: modifying circuit
24: EXOR gate
30: main logic circuit
31: input bus
32: output bus
41_0 to 41_15: D-flip-flop (DFF)
42: multiplexer (MUX)
43: clock line
44: registered value input line
44: data input line

BEST MODES FOR CARRYING OUT THE INVENTION

Hereinafter, best modes for carrying out the present invention will be described with reference to the accompanying drawings.

First Embodiment

Figure 5:
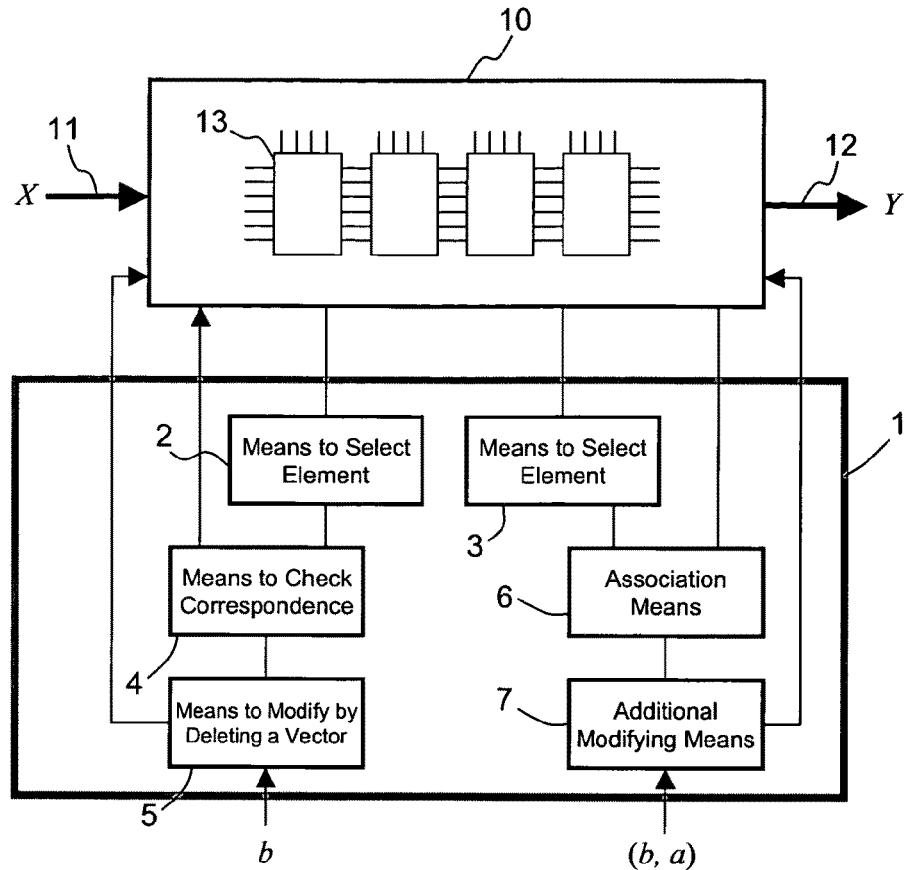
FIG. 5 shows the configuration of a reconfigurable multi-level logic network according to a first embodiment of the present invention.

FIG. 5 shows the configuration of a reconfigurable multi-level logic network according to a first embodiment of the present invention. This reconfigurable multi-level logic network is configured as a system that combines a multi-level logic network 10 and a reconfiguration device 1. The reconfiguration circuit 1 is a device for reconfiguring the multi-level logic network 10 along with logic modification of the multi-level logic network 10.

Figure 2:
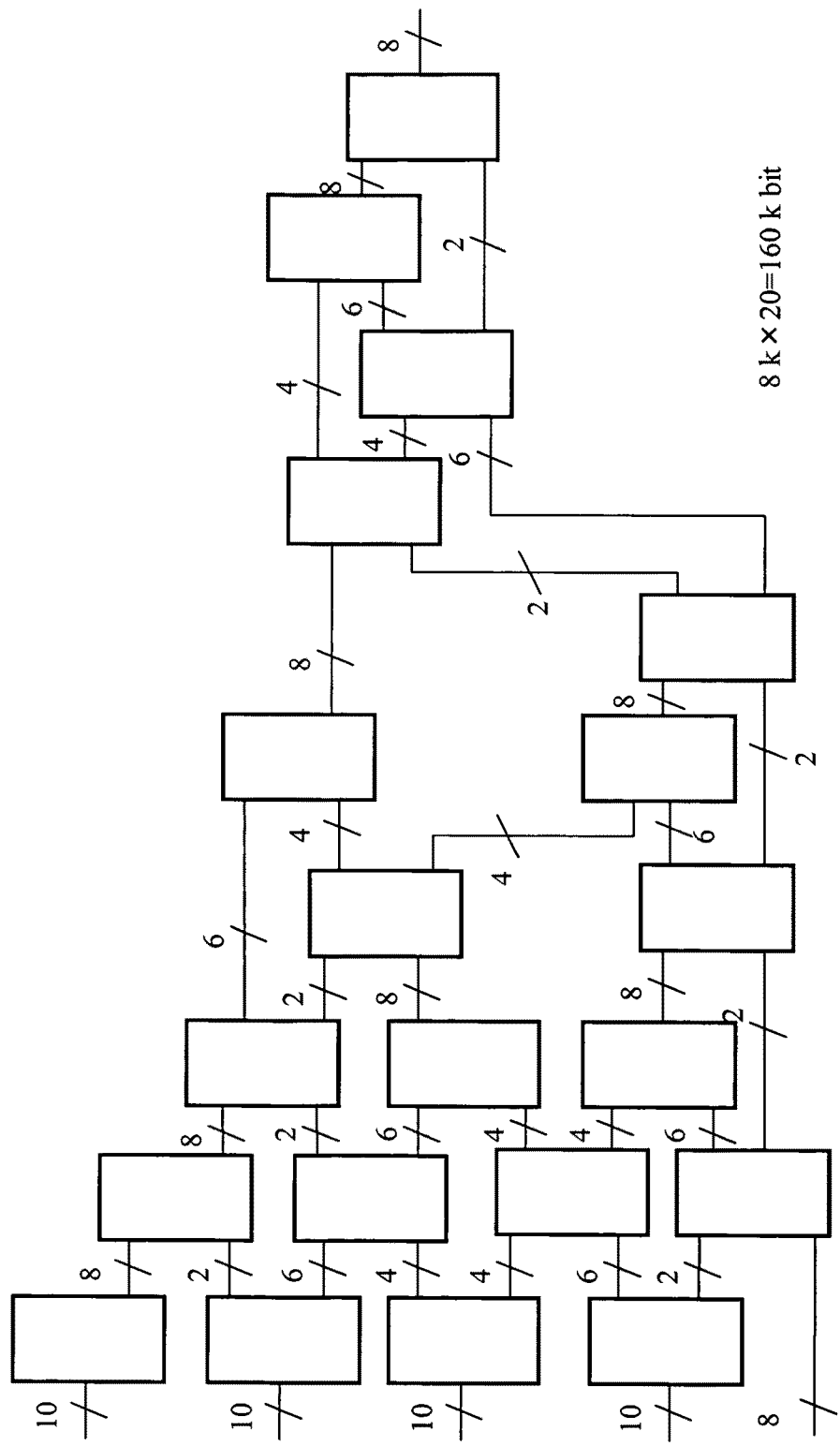
FIG. 2 shows an example of an address generation circuit (p=10) configured by pq elements.
Figure 3:
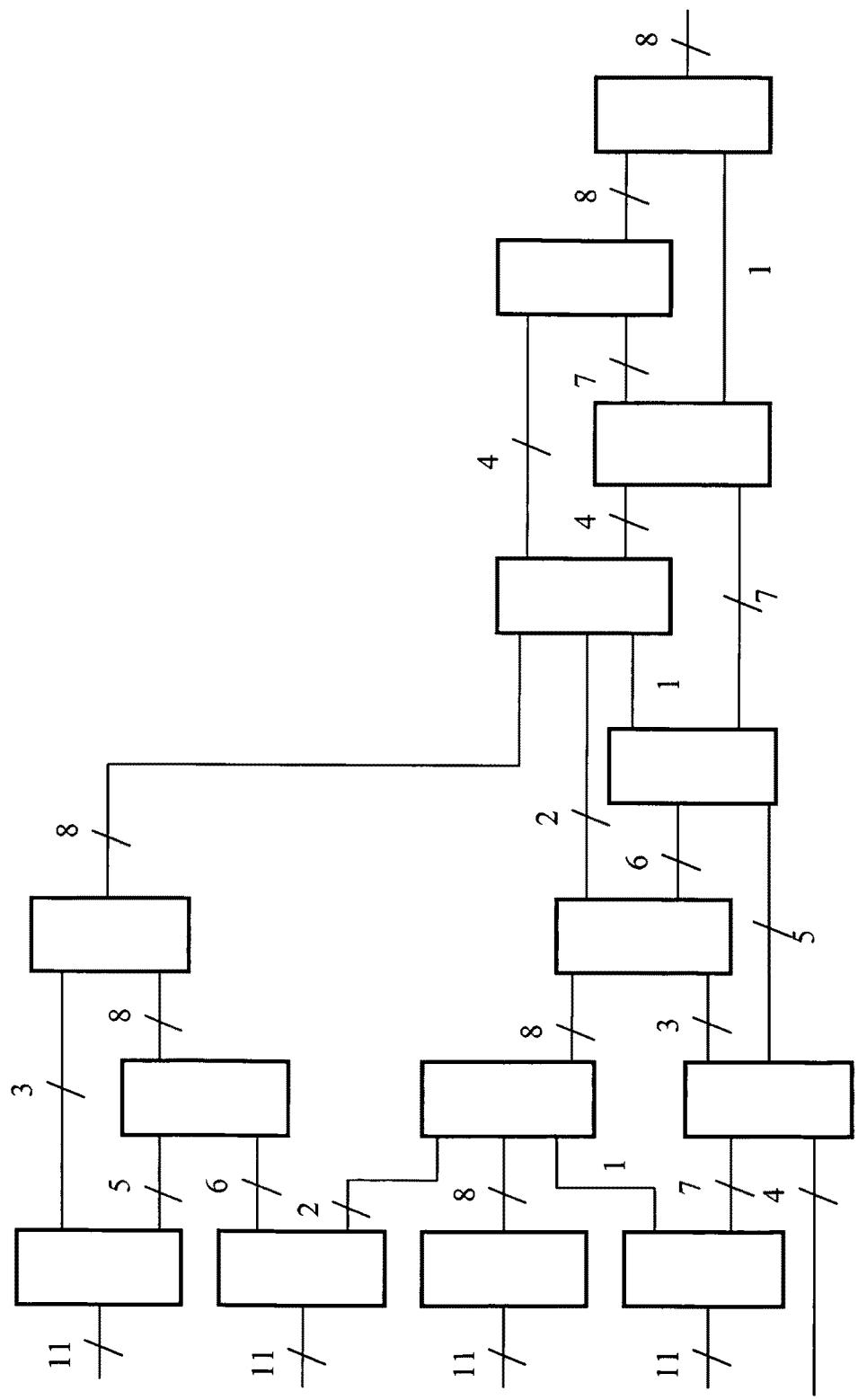
FIG. 3 shows an example of an address generation circuit (p=11) configured by pq elements.
Figure 4:
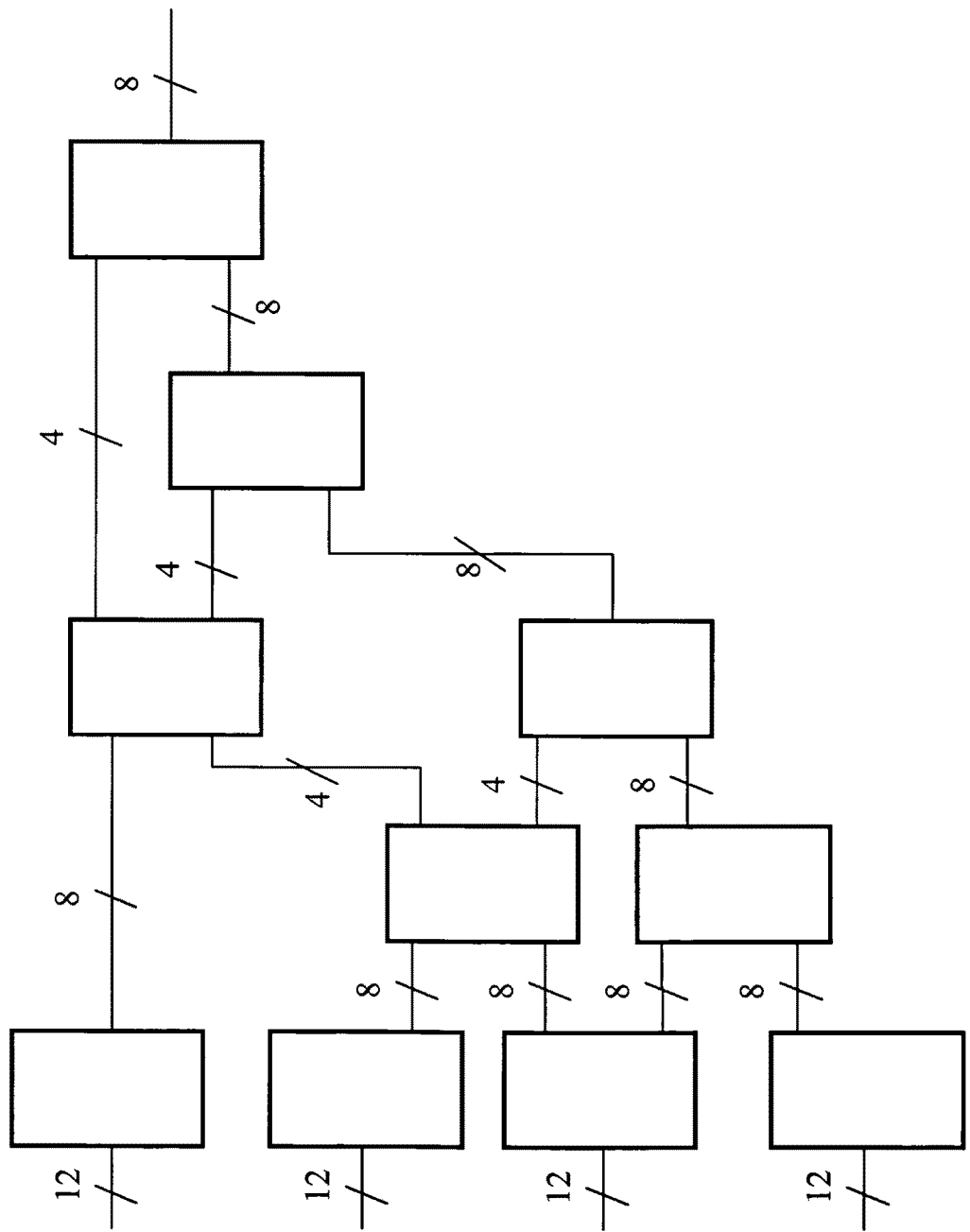
FIG. 4 shows an example of an address generation circuit (p=12) configured by pq elements.

The multi-level logic network 10 is a logic circuit for operating an objective logic function F(X) with an input variable X. The multi-level logic network 10 includes plural pq elements 13. Each pq element 13 stores an LUT of a subfunction obtained by functional decomposition of the objective logic function F(X). In addition, the pq elements 13 are connected in circuit according to a connection relation of inputs and outputs of each subfunction. The multi-level logic network 10 may be configured using an LUT cascade circuit or a pq circuit network as illustrated in FIGS. 2 to 4.

The input variable X is an n-ary variable of a binary vector. An output variable Y of the objective logic function F(X) is an m-ary variable of a binary vector. The input variable X can take $2^n$ values. Among those, k ($k<2^n$) input vectors are referred to as registered vectors". The other vectors are referred to as invalid vectors".

An input vector b is applied as the input variable X from an input data bus 11 of the multi-level logic network 10. Further, an output vector a is produced as the output variable Y=F(X) from an output data bus 12 of the multi-level logic network 10.

The reconfiguration circuit 1 includes means to select element 2 and 3, means to check correspondence 4, means to modify by deleting a vector 5, means for association 6, means to modify by adding a vector 7, and the multi-level logic network 10.

Following logic modification that sets an output vector F(b) corresponding to an input vector b of the objective logic function F(X) as an "invalid value", deletion processing is executed, and the multi-level logic network 10 is reconfigured. Upon the deletion processing, means to select element 2 selects the unmodified pq elements 13 one by one from the nearest pq element $E_G$ to an output side. Means to check correspondence 4 checks whether the input vector b corresponds to an output vector c one to one in the LUTs of the pq element $E_G$. Means to modify by deleting a vector 5 rewrites an output value corresponding to the input vector b as an "invalid value" and considers the pq element $E_G$ modified in case that the input vector b corresponds to the output vector c one to one in the LUTs of the pq element $E_G$.

On the other hand, along with logic modification to add an output vector a corresponding to the input vector b to an output vector set of the objective logic function F(X), addition processing is performed, and the multi-level logic network 10 is reconfigured. Upon the addition processing, means to select element 3 selects the unmodified pq elements 13 from the furthest pq element $E_G$ from the output side one by one. Means for association 6 considers the pq element $E_G$ modified if the pq element $E_G$ is not nearest to an output side. Moreover, at this time, if an output vector c corresponding to the input vector b out of the output vectors of the LUT of the pq element $E_G$ is an "invalid value", means for association 6 changes the output vector c into a vector value not used as an output vector of the pq element. Means to modify by adding a vector 7 rewrites an output value corresponding to the input vector b of the LUT of the pq element $E_G$ as an output vector a and considers the pq element $E_G$ modified if the pq element $E_G$ is nearest to an output side.

Operations of the thus-configured multi-level logic network reconfiguration circuit 1 of the first embodiment will be described hereinbelow.

Figure 6:
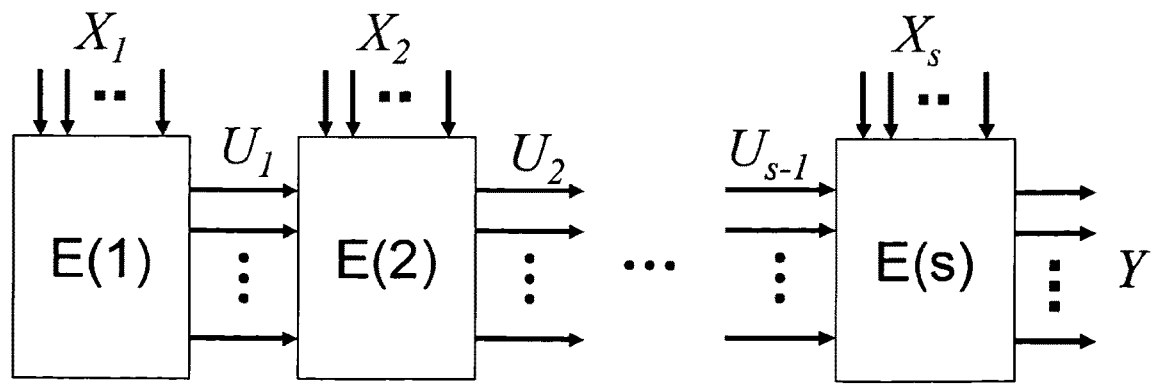
FIG. 6 shows a cascade logic circuit including s pq elements E(1), E(2), . . . , E(s) that are connected in series.

In the following description, the multi-level logic network 10 is assumed a cascade logic circuit including s pq elements E(1), E(2), ..., E(s) that are series-connected as shown in FIG. 6. The pq elements are connected in the order of E(1), E(2), ..., E(s) from an input side.

Provided that X represents an input variable, $X=(X_1, X_2, \ldots, X_s)$ represents partition of the input variable X, and $Y=F(X)$ represents an output variable of the objective logic function $F(X)$ corresponding to the input variable X, if the objective logic function $F(X)$ is functional-decomposed to subfunctions $G_1, G_2, \ldots, G_s$ based on Expression (11) below. In Expression (11), $U_i$ ($i=1, 2, \ldots, s-1$) represents an intermediate variable.

$$U_1 = G_1(X_1) \quad (11)$$
$$U_2 = G_2(X_2, U_1)$$
$$\vdots$$
$$U_s = G_s(X_s, U_{s-1})$$
$$Y = U_s$$

A pq element $E(i)(i=1, 2, \ldots, s)$ stores an LUT of an intermediate function $G_i$. A pq element E(1) receives an input variable $X_1$. In response thereto, the pq element E(1) produces an output variable $U_1=G_1(X_1)$. The pq element E(i) ($i=2, 3, \ldots, s$) receives an output variable $U_{i-1}$ of a previous pq element E(i−1) and an input variable $X_i$. In response thereto, the pq element E(i) produces an output variable $U_i=G_i(X_i, U_{i-1})$. Further, an output variable $U_s$ of a pq element E(s) is an output variable Y.

Figure 7:
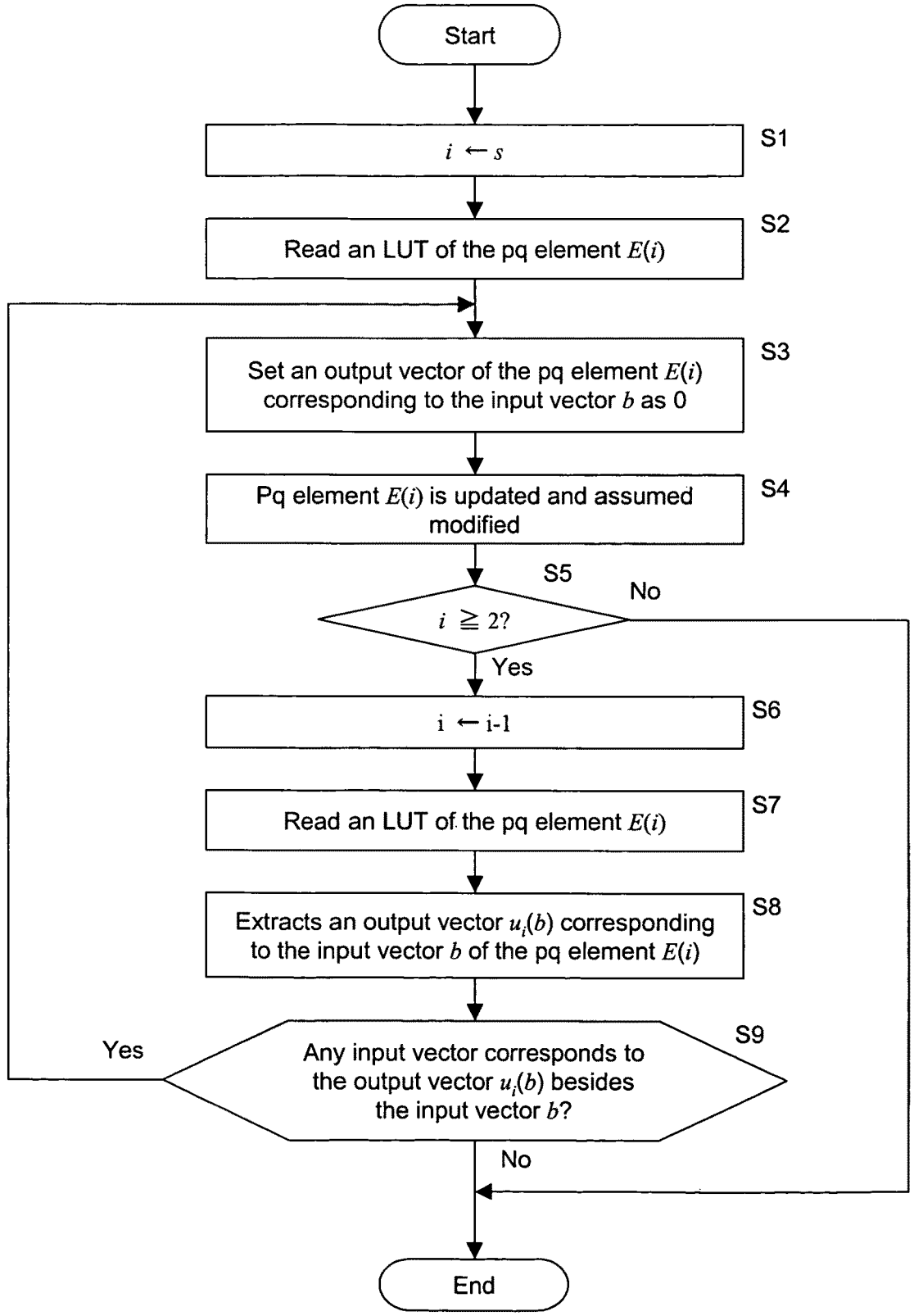
FIG. 7 is a flowchart showing processing for deleting a registered vector of an objective logic function F(X) with a reconfiguration device 1.

To begin with, deletion processing for deleting a registered vector of the objective logic function F(X) is described. FIG. 7 is a flowchart showing the deletion processing for deleting a registered vector of the objective logic function F(X) with the reconfiguration circuit 1.

In this example, reconfiguration of the multi-level logic network 10 following logic modification for deleting a registered vector of the objective logic function F(X) b is discussed. Here, a part value of the input vector b for a part variable $X_i$ of the input variable X is represented by $b_i$.

First, in step S1, when a target registered vector b is applied, means to select element 2 sets the index i to s. The index i is an index indicating a number of a selected pq element. With this operation, the nearest pq element E(s) to an output side is selected.

Next, in step S2, means to select element 2 reads an LUT of the pq element E(i).

Next, in step S3, means to modify by deleting a vector 5 sets an output vector $u_i(b)$ corresponding to the input vector b as 0 in the read LUT. The output vector $u_i(b)$ corresponding to the input vector b is an output vector corresponding to a part value b, and an output vector (b) of a previous pq element E(i−1). The output vector $u_{i-1}(b)$ of the previous pq element E(i−1) can be obtained by applying the input vector b to the multi-level logic network 10 and executing calculation to derive an intermediate variable $U_{1-1}$.

Next, in step S4, the modified LUT is written to the pq element E(i) to thereby update the pq element E(i).

Next, in step S5, means to select element 2 determines whether the index i is 2 or more. If the index i is 1, the registered vector deletion processing is terminated, and otherwise, the processing advances to the next step S6.

In step S6, means to select element 2 decrements the index i indicating a number of a selected element by 1.

Next, in step S7, means to select element 2 reads an LUT of the pq element E(i).

Next, in step S8, means to check correspondence 4 extracts an output vector $u_i(b)$ corresponding to the input vector b of the pq element E(i). The output vector $u_i(b)$ corresponding to the input vector b is an output vector corresponding to a part value $b_i$ and an output vector $u_{i-1}(b)$ of a previous pq element E(i−1) (part value $b_i$ if i=1). The output vector $u_{i-1}(b)$ of the previous pq element E(i−1) can be obtained by applying the input vector b to the multi-level logic network 10 and executing calculation to derive an intermediate variable $U_{i-1}$.

Next, in step S9, means to check correspondence 4 determines whether any input vector corresponds to the output vector $u_i(b)$ besides the input vector b. The determination is completed by checking an output value of an LUT and checking whether two or more vectors take the same value as the output vector $u_i(b)$. If two or more input vectors corresponding to the output vector are found, the registered vector deletion processing is terminated, and otherwise, the processing returns to step S3.

Through the series of processings, it is possible to execute the reconfiguration of the multi-level logic network 10 following the logic modification for deleting the registered vector of the objective logic function F(X) b. This processing only requires an operation of reading and rewriting an LUT of the pq element E(i) and thus can be performed at high speeds. Further, since this processing does not require complicated computation processing, means to select element 2, means to check correspondence 4, and means to modify by deleting a vector 5 can be implemented with a simple circuit.

Figure 8:
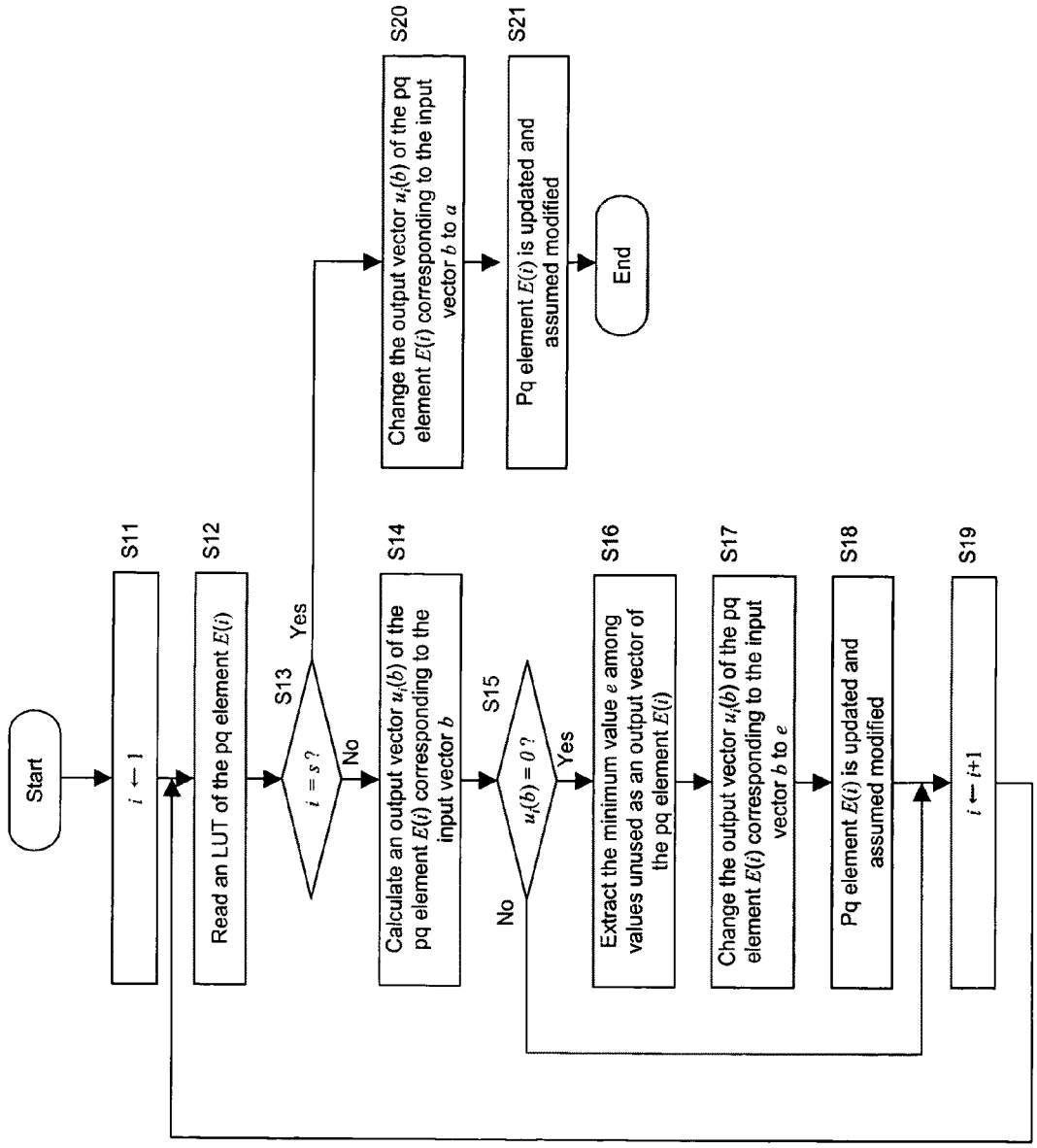
FIG. 8 is a flowchart showing processing for adding a registered vector of an objective logic function F(X) with the reconfiguration device 1.

Next, addition processing for adding a registered vector of the objective logic function F(X) is described. FIG. 8 is a flowchart showing the addition processing for adding a registered vector of the objective logic function F(X) with the reconfiguration circuit 1.

In this example, following logic modification for adding a registered vector of the objective logic function F(X) b, reconfiguration of the multi-level logic network 10 is performed. Here, an output vector of the objective logic function F(X) corresponding to a registered vector b is represented by a, and a part value of the input vector b corresponding to the part variable $X_i$ of the input variable X is represented by $b_i$.

First, in step S11, when the registered vector b to be added and the output vector a are applied, means to select element 3 sets the index i indicating the number of a selected pq element as 1. As a result, the nearest pq element E(1) to the input side is selected.

Next, in step S12, means to select element 3 reads an LUT of the pq element E(i).

Next, in step S13, means for association 6 determines whether the index i is the maximum value s. If i=s, the processing advances to step S20, and otherwise, to the next step S14.

In step S14, means for association 6 calculates an output vector $u_i(b)$ corresponding to the input vector b in the read LUT. The output vector $u_i(b)$ corresponding to the input vector b is an output vector corresponding to the part value $b_i$ and the output vector $u_{i-1}(b)$ of the previous pq element E(i−1) (part value $b_i$ if i=1). The output vector $u_{i-1}(b)$ of the previous pq element E(i−1) can be obtained by applying the input vector b to the multi-level logic network 10 and executing calculation to derive an intermediate variable $U_{i-1}$.

Next, in step S15, means for association 6 determines whether the output vector $u_i(b)$ is 0. If $u_i(b) \neq 0$, the processing advances to step S19. If s=0, the processing advances to the next step S16.

In step S16, means for association 6 checks output vectors of the LUT of the pq element E(i) to extract the minimum value (vector) e among values unused as an output vector.

Next, in step S17, means for association 6 changes the output vector $u_i(b)$ corresponding to the input vector b of the LUT of the pq element E(i) to e.

Next, in step S18, means for association 6 writes the updated LUT to the pq element E(i) to thereby update the pq element E(i).

Next, in step S19, means to select element 3 increments the index i indicating a number of a selected element by 1 and the processing returns to step S12.

On the other hand, in step S13, if i=s, in step S20, means to modify by adding a vector 7 changes the output vector $u_i(b)$ corresponding to the input vector b of the LUT of the pq element E(i) to the output vector a.

Then, in step S21, means to modify by adding a vector 7 writes the updated LUT to the pq element E(i) to thereby update the pq element E(i).

Through the series of processings, it is possible to execute the reconfiguration of the multi-level logic network 10 following the logic modification for adding the registered vector of the objective logic function F(X) b. This processing only requires an operation of reading and rewriting an LUT of the pq element E(i) and thus can be performed at high speeds. Further, since this processing does not require complicated computation processing, means to select element 2 and means to modify by deleting a vector 5 can be implemented with a simple circuit.

Further, in the multi-level logic network 10 of this embodiment, reconfiguration can be executed only by rewriting a memory. More specifically, it is necessary to change wiring structure along with the reconfiguration of the multi-level logic network 10. Thus, the reconfiguration can be easily carried out without considering an influence of wiring delay etc. Moreover, the logic circuit can be dynamically reconfigured in real time during operations of the logic circuit.

Example 5

An address generation function F(X) involving five variables as shown in Table 5 is explained.

TABLE 5

| $x_5$ | $x_4$ | $x_3$ | $x_2$ | $x_1$ | $f_3$ | $f_2$ | $f_1$ |
|---|---|---|---|---|---|---|---|
| 0 | 0 | 1 | 1 | 1 | 0 | 0 | 1 |
| 0 | 1 | 0 | 1 | 0 | 0 | 1 | 0 |
| 0 | 1 | 1 | 0 | 0 | 0 | 1 | 1 |
| 0 | 1 | 1 | 0 | 1 | 1 | 0 | 0 |
| 1 | 0 | 0 | 1 | 0 | 1 | 0 | 1 |
| 1 | 1 | 0 | 0 | 0 | 1 | 1 | 0 |

Figure 9:
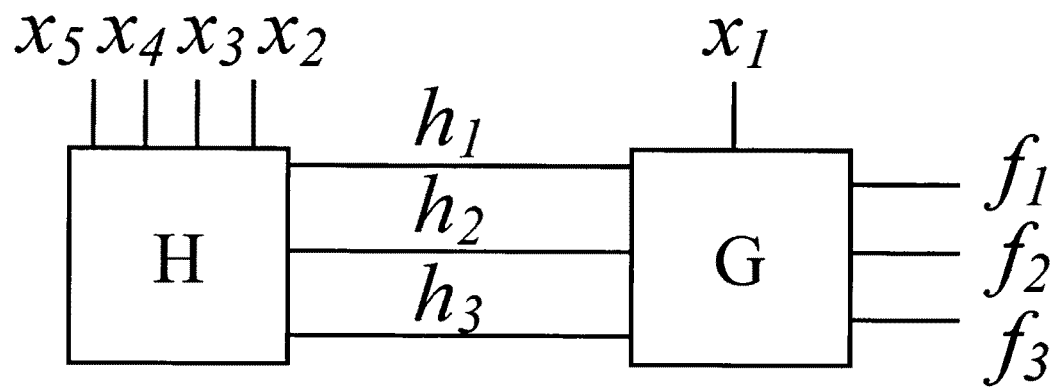
FIG. 9 shows an LUT cascade logic circuit that achieves an address generation function F(X) illustrated in Example 5.

Functional decomposition $\{F(X)=G(H(X_1), X_2)\}$ is executed on partition X of the input variable X; partition $X=(X_1, X_2)$, $X_1=(x_5, x_4, x_3, x_2)$, $X_2=(x_1)$. As a result, the address generation function F(X) is obtained using an LUT cascade logic circuit including two pq elements as shown in FIG. 9. In this example, truth tables of subfunctions H and G are Tables 6 and 7. The truth table (Table 6) of the subfunction H is stored as an LUT in a pq element on the input side. Further, the truth table (Table 7) of the subfunction G is stored as an LUT in a pq element on the output side. Numerical values on the left of each row in Tables 6 and 7 each indicate an index of a registered vector in each row.

TABLE 6

TRUTH TABLE FOR FUNCTION H

| $x_5$ | $x_4$ | $x_3$ | $x_2$ | $h_3$ | $h_2$ | $h_1$ | |
|---|---|---|---|---|---|---|---|
| 0 | 0 | 1 | 1 | 0 | 0 | 1 | 1 |
| 0 | 1 | 0 | 1 | 0 | 1 | 0 | 2 |
| 0 | 1 | 1 | 0 | 0 | 1 | 1 | 3, 4 |
| 1 | 0 | 0 | 1 | 1 | 0 | 1 | 5 |
| 1 | 1 | 0 | 0 | 1 | 1 | 0 | 6 |

TABLE 7

TRUTH TABLE FOR FUNCTION G

| $h_3$ | $h_2$ | $h_1$ | $x_1$ | $f_3$ | $f_2$ | $f_1$ | |
|---|---|---|---|---|---|---|---|
| 0 | 0 | 1 | 1 | 0 | 0 | 1 | 1 |
| 1 | 0 | 1 | 0 | 0 | 1 | 0 | 2 |
| 0 | 1 | 1 | 0 | 0 | 1 | 1 | 3 |
| 0 | 1 | 1 | 1 | 1 | 0 | 0 | 4 |
| 1 | 0 | 1 | 0 | 1 | 0 | 1 | 5 |
| 1 | 1 | 0 | 0 | 1 | 1 | 0 | 6 |

A registered vector $b_7$ $\{b_7=(x_5\,x_4\,x_3\,x_2\,x_1)=(11001)\}$ of the address generation function F(X) is added. Table 8 is a truth table for the registered vector $b_7$. An output vector corresponding to the registered vector $b_7$ is given (111).

TABLE 8

| $x_5$ | $x_4$ | $x_3$ | $x_2$ | $x_1$ | $f_3$ | $f_2$ | $f_1$ | |
|---|---|---|---|---|---|---|---|---|
| 1 | 1 | 0 | 0 | 1 | 1 | 1 | 1 | 7 |

Next, an LUT of each pq element is rewritten in accordance with a procedure of the flowchart of FIG. 8. Here, an output vector corresponding to the input vector b of a subfunction H stored in the pq element on the input side is $(h_1, h_2, h_3)=(110)$ with reference to the record of $(x_5\,x_4\,x_3\,x_2)=(1100)$ in Table 6. Since this value is not 0, an LUT for the subfunction H is not changed. In this case, the input vector b is associated with the record of $(x_5\,x_4\,x_3\,x_2)=(1100)$ as shown in Table 9.

TABLE 9

TRUTH TABLE FOR FUNCTION H

| $x_5$ | $x_4$ | $x_3$ | $x_2$ | $h_3$ | $h_2$ | $h_1$ | |
|---|---|---|---|---|---|---|---|
| 0 | 0 | 1 | 1 | 0 | 0 | 1 | 1 |
| 0 | 1 | 0 | 1 | 0 | 1 | 0 | 2 |
| 0 | 1 | 1 | 0 | 0 | 1 | 1 | 3, 4 |
| 1 | 0 | 0 | 1 | 1 | 0 | 1 | 5 |
| 1 | 1 | 0 | 0 | ░ | ░ | ░ | 6, 7 |

Next, considering the subfunction G stored in the pq element on the output side, an input vector of the subfunction G corresponding to the input vector b is $\{(h_1, h_2, h_3\,x_1)=(1101)\}$. Thus, as shown in Table 10, $\{(h_1, h_2, h_3\,x_1\,f_1\,f_2\,f_3)=(1101111)\}$ is added to an LUT for the subfunction G. Thus, reconfiguration of each pq element following the addition of the registered vector $b_7$ is completed.

TABLE 10

TRUTH TABLE FOR FUNCTION G

| h₃ | h₂ | h₁ | x₁ | f₃ | f₂ | f₁ | |
|---|---|---|---|---|---|---|---|
| 0 | 0 | 1 | 1 | 0 | 0 | 1 | 1 |
| 1 | 0 | 1 | 0 | 0 | 1 | 0 | 2 |
| 0 | 1 | 1 | 0 | 0 | 1 | 1 | 3 |
| 0 | 1 | 1 | 1 | 1 | 0 | 0 | 4 |
| 1 | 0 | 1 | 0 | 1 | 0 | 1 | 5 |
| 1 | 1 | 0 | 0 | 1 | 1 | 0 | 6 |
| 1 | 1 | 0 | 1 |   |   |   | 7 |

Next, reconfiguration of each pq element following deletion of a registered vector is explained. The case of deleting a registered vector $b_3$ $\{b_3=(01100)\}$ from vectors registered in an address table (Table 5) is described by way of example.

An LUT of the pq element on the output side is first rewritten in accordance with a procedure of the flowchart of FIG. 7. Referring to Table 10, an input vector of the subfunction G corresponding to the registered vector $b_3$ is $\{(h_1, h_2, h_3\ x_1)=(0110)\}$. An output vector corresponding to this vector is changed to (000), and the LUT of the pq element on the output side is rewritten as shown in Table 11.

TABLE 11

TRUTH TABLE FOR FUNCTION G

| h₃ | h₂ | h₁ | x₁ | f₃ | f₂ | f₁ | |
|---|---|---|---|---|---|---|---|
| 0 | 0 | 1 | 1 | 0 | 0 | 1 | 1 |
| 1 | 0 | 1 | 0 | 0 | 1 | 0 | 2 |
|   |   |   | 0 |   |   |   | 3 |
|   |   |   | 1 | 1 | 0 | 0 | 4 |
| 1 | 0 | 1 | 0 | 1 | 0 | 1 | 5 |
| 1 | 1 | 0 | 0 | 1 | 1 | 0 | 6 |
| 1 | 1 | 0 | 1 | 1 | 1 | 1 | 7 |

Next, the pq element on the input side is considered. In this case, as is apparent from the truth table for the subfunction G not updated (Table 10), $b_4=(01111)$ is listed as a registered vector, an output vector $(h_1, h_2, h_3)$ of a previous LUT of which has non-zero output similar to the output vector (011) for the registered vector $b_3$ besides $b_3$. Thus, an LUT of the pq element on the input side is not rewritten. With this operation, reconfiguration of each pq element following the deletion of the registered vector $b_3$ is completed.

Next, the case of additionally deleting the registered vector $b_4$ $\{b_4=(01101)\}$ is considered. An LUT of the pq element on the output side is first rewritten in accordance with a procedure of the flowchart of FIG. 7. Referring to Table 9, an input vector of the subfunction G corresponding to the registered vector $b_4$ is $\{(h_1, h_2, h_3\ x_1)=(0111)\}$. An output vector corresponding to the input vector is changed to (000), and the LUT of the pq element on the output side is rewritten as shown in Table 12.

TABLE 12

TRUTH TABLE FOR FUNCTION G

| h₃ | h₂ | h₁ | x₁ | f₃ | f₂ | f₁ | |
|---|---|---|---|---|---|---|---|
| 0 | 0 | 1 | 1 | 0 | 0 | 1 | 1 |
| 1 | 0 | 1 | 0 | 0 | 1 | 0 | 2 |
| 0 | 1 | 1 | 0 | 0 | 0 | 0 | 3 |
|   |   |   | 1 |   |   |   | 4 |
| 1 | 0 | 1 | 0 | 1 | 0 | 1 | 5 |
| 1 | 1 | 0 | 0 | 1 | 1 | 0 | 6 |
| 1 | 1 | 0 | 1 | 1 | 1 | 1 | 7 |

Next, the pq element on the input side is considered. In this case, as is apparent from the truth table for the subfunction G not updated (Table 11), there is no registered vector, an output vector $(h_1, h_2, h_3)$ of a previous LUT of which has non-zero output similar to an output vector (011) for the registered vector $b_4$. Therefore, an output vector $\{(h_1, h_2, h_3)=(100)\}$ corresponding to an input vector $\{(x_5\ x_4\ x_3\ x_2)=(0111)\}$ of the subfunction H corresponding to the registered vector $b_4$ is changed to (000) with respect to the pq element on the input side. Thus, an LUT of the pq element on the input side is updated as shown in Table 13. In this way, reconfiguration of each pq element following the deletion of the registered vector $b_4$ is completed.

TABLE 13

TRUTH TABLE FOR FUNCTION H

| x₅ | x₄ | x₃ | x₂ | h₃ | h₂ | h₁ | |
|---|---|---|---|---|---|---|---|
| 0 | 0 | 1 | 1 | 0 | 0 | 1 | 1 |
| 0 | 1 | 0 | 1 | 0 | 1 | 0 | 2 |
| 0 | 1 | 1 | 0 |   |   |   | 4 |
| 1 | 0 | 0 | 1 | 1 | 0 | 1 | 5 |
| 1 | 1 | 0 | 0 | 1 | 1 | 0 | 6 |

(End of Example)

Second Embodiment

Figure 10:
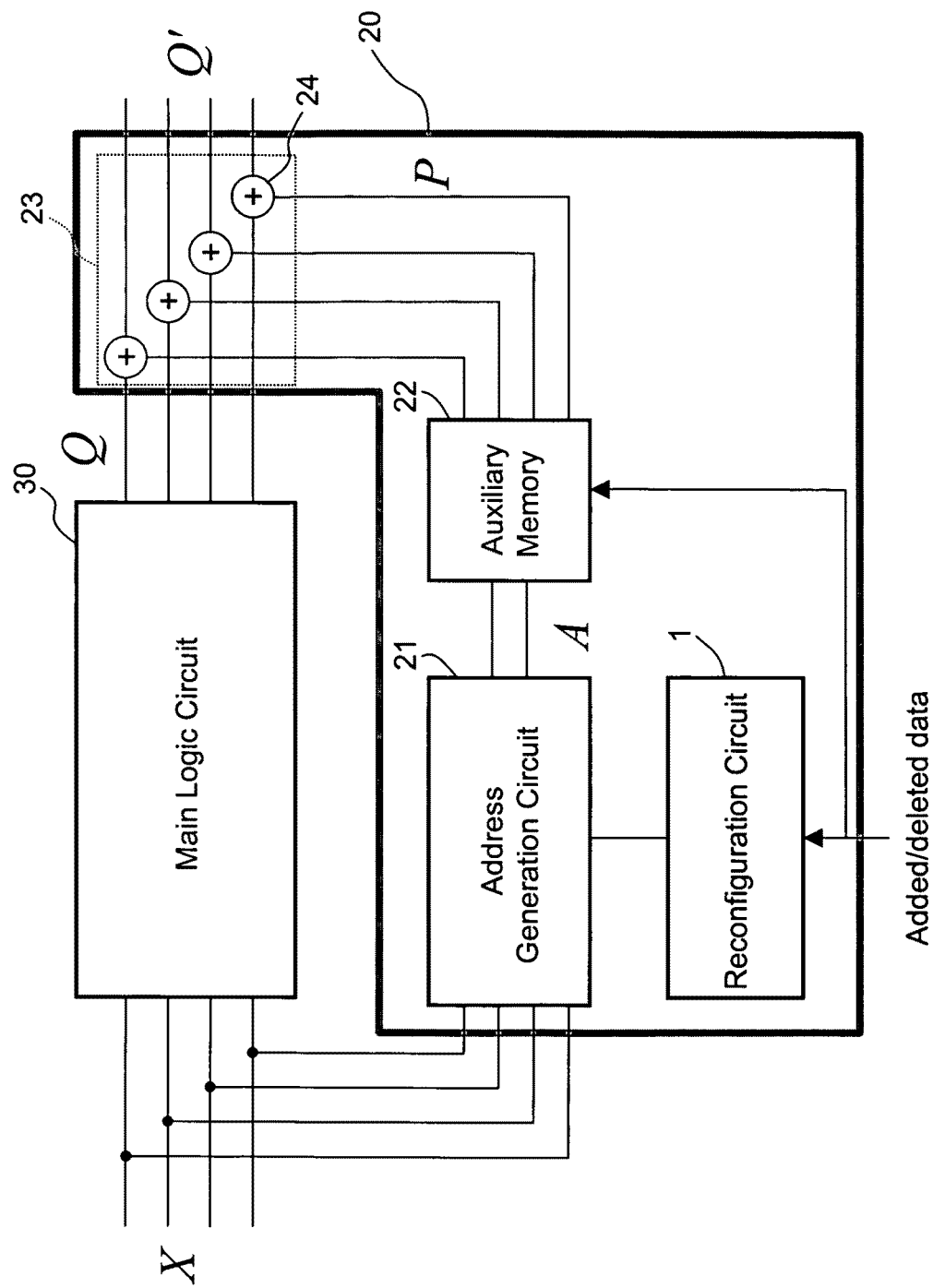
FIG. 10 shows the configuration of a device to modify logic networks 20 according to a second embodiment of the present invention.

FIG. 10 shows the configuration of a device to modify logic networks 20 according to a second embodiment of the present invention. In FIG. 10, a main logic circuit 30 is a logic circuit subjected to logic modification, which is a memory configured as a specific LSI (ASIC), a CPU, or the like. It is assumed that an input variable of the main logic circuit 30 is $\{X=(x_1\ x_2\ \ldots\ x_n)(\in B^n, B=\{0, 1\})\}$, an output variable thereof is $\{Q=Q(X)=(q_1\ q_2\ \ldots\ q_m)\ (\in B^m)\}$, and an output variable modified with the device to modify logic networks 20 is $\{Q'=(q_1'\ q_2'\ \ldots\ q_m')\ (\in B^m)\}$. The main logic circuit 30 operates an objective logic function Q(X) for the input variable X.

The device to modify logic networks 20 changes an output vector $Q(b_i)$ of the main logic circuit 30 corresponding to a particular object input vector $b_i$ among input vectors b applied as the input variable X, to a modification output vector $Q'(b_i)$. The device to modify logic networks 20 includes an address generation circuit 21, an auxiliary memory 22, a modifying circuit 23, and the reconfiguration circuit 1. Here, the reconfiguration circuit 1 is similar to the reconfiguration circuit 1 for a multi-level logic network described in the first embodiment.

The auxiliary memory 22 is such that a vector for modification $\{P_i=(p_{i1}\ p_{i2}\ \ldots\ p_{im})\}$ for modifying each output vector $Q(b_i)$ to the modification output vector $Q'(b_i)$ in accordance with each object input vector $b_i$ is registered at a prescribed address $A_i$. The auxiliary memory 22 produces the vector for modification $P_i$ if the address $A_i$ at which the vector for modification $P_i$ is registered is applied, and otherwise, produces 0 as an "invalid value".

If the vector for modification $P_i$ produced from the auxiliary memory 22 is produced, the modifying circuit 23 produces a modification output vector $Q_i'$ based on the vector for modification $P_i$ and the output vector $Q(b_i)$ produced from the main logic circuit 30. In the second embodiment, the modifying circuit 23 is configured by EXOR gates 24 provided for each output line of the main logic circuit 30. Each EXOR gate 24 calculates the modification output vector $Q_i'=(q_{i1}', q_{i2}', \ldots, q_{im}')$ through exclusive-OR operation between elements $q_1, q_2, \ldots, q_m$ of the output vector Q and elements $p_{i1}, p_{i2}, \ldots, p_{im}$ of the vector for modification $P_i$.

$$q'_j = q_j \oplus p_{ij}\ (i=1,2,\ldots,k; j=1,2,\ldots,m) \qquad (12)$$

Thus, a value of the vector for modification $P_i$ is set so as to obtain a target modification output vector $Q_i'$ based on above Expression (12).

The address generation circuit 21 produces an address of the auxiliary memory 22 in accordance with each input vector b applied as the input variable X. In this example, the address generation circuit 21 operates an address generation function F(X) to produce an address $A_i$ where a vector for modification $P_i$ is registered, for each object input vector $b_i$ and produce an "invalid value" (0) for the other input vectors b.

Further, the address generation circuit 21 is configured by a multi-level logic network including the above pq elements connected in multiple stages.

The reconfiguration circuit 1 reconfigures an LUT of each q element of the address generation circuit 21, following the modification of the address generation function F(X) operated by the address generation circuit 21. The reconfiguration process is similar to that of the first embodiment.

Operations of the thus-configured device to modify logic networks 20 of the second embodiment will be described hereinbelow.

First, if input vectors b other than an object input vector $b_i$ are applied as the input variable X, the address generation circuit 21 produces 0 ("invalid value") as an output vector a. Thus, the auxiliary memory 22 produces 0 as a vector for modification P. Each EXOR gate 24 operates and produces exclusive OR between an output value $q_j$ of the main logic circuit 30 and 0, that is, the output value $q_j$. Accordingly, in this case, the output vector Q is not modified and produced as it is.

On the other hand, if an object input vector $b_i$ is applied as the input variable X, the address generation circuit 21 produces an address value Ai of the auxiliary memory 22, where the vector for modification $P_i$ is stored as the output vector a. Thus, the auxiliary memory 22 produces a vector for modification $P_i$ as a vector for modification P. Each EXOR gate 24 operates and produces exclusive OR ($q_{ij}'$) between the output value $q_j$ of the main logic circuit 30 and an element $p_{ij}$ of the vector for modification. In this way, the output vector is modified.

In this embodiment, since the multi-level logic network configuring by connecting pq elements in multiple stages is used as the address generation circuit 21, footprint of the device to modify logic networks 20 can be reduced. Further, even if logic modification is additionally executed, the address generation circuit 21 can be easily reconfigured using the reconfiguration circuit 1.

Third Embodiment

Figure 11:
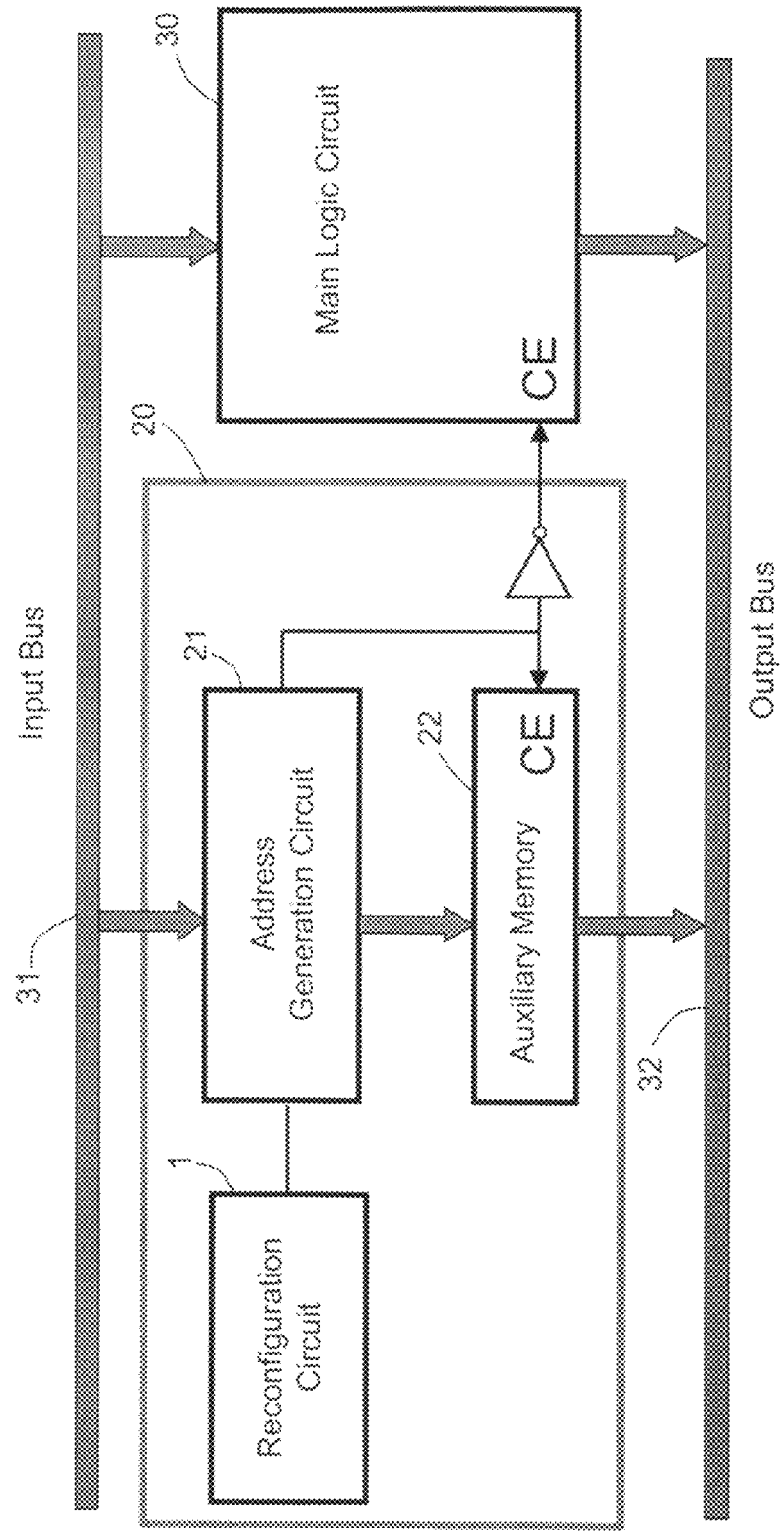
FIG. 11 shows the configuration of the device to modify logic networks 20 according to a third embodiment of the present invention.

FIG. 11 shows the configuration of the device to modify logic networks 20 according to a third embodiment of the present invention. In FIG. 11, the reconfiguration circuit 1, the address generation circuit 21, the auxiliary memory 22, and the main logic circuit 30 are the same as those of FIG. 10. In this embodiment, the auxiliary memory 22 stores the modification output vector $Q_i'$ as it is for each object input vector $b_i$. Further, a tri-state buffer (not shown) is provided as means to modify at an output stage of the main logic circuit 30 and the auxiliary memory 22.

If the address generation circuit 21 produces an "invalid value" if the input variable X applied from the input bus 31 is not equal to the object input vector $b_i$. The tri-state buffer at the output stage of the main logic circuit 30 is in a high-impedance state if an output value of the address generation circuit 21 is not an "invalid value", and otherwise, in a low-impedance state. Further, the tri-state buffer at the output stage of the auxiliary memory 22 is in a high-impedance state if an output value of the address generation circuit 21 is not an "invalid value", and otherwise, in a low-impedance state.

Thus, if a value of the input variable X is not equal to the object input vector $b_i$, an output vector of the main logic circuit 30 is produced to the output bus 32. If a value of the input variable X is equal to the object input vector $b_i$, an output vector of the auxiliary memory 22 is produced to the output bus 32.

Fourth Embodiment

Figure 12:
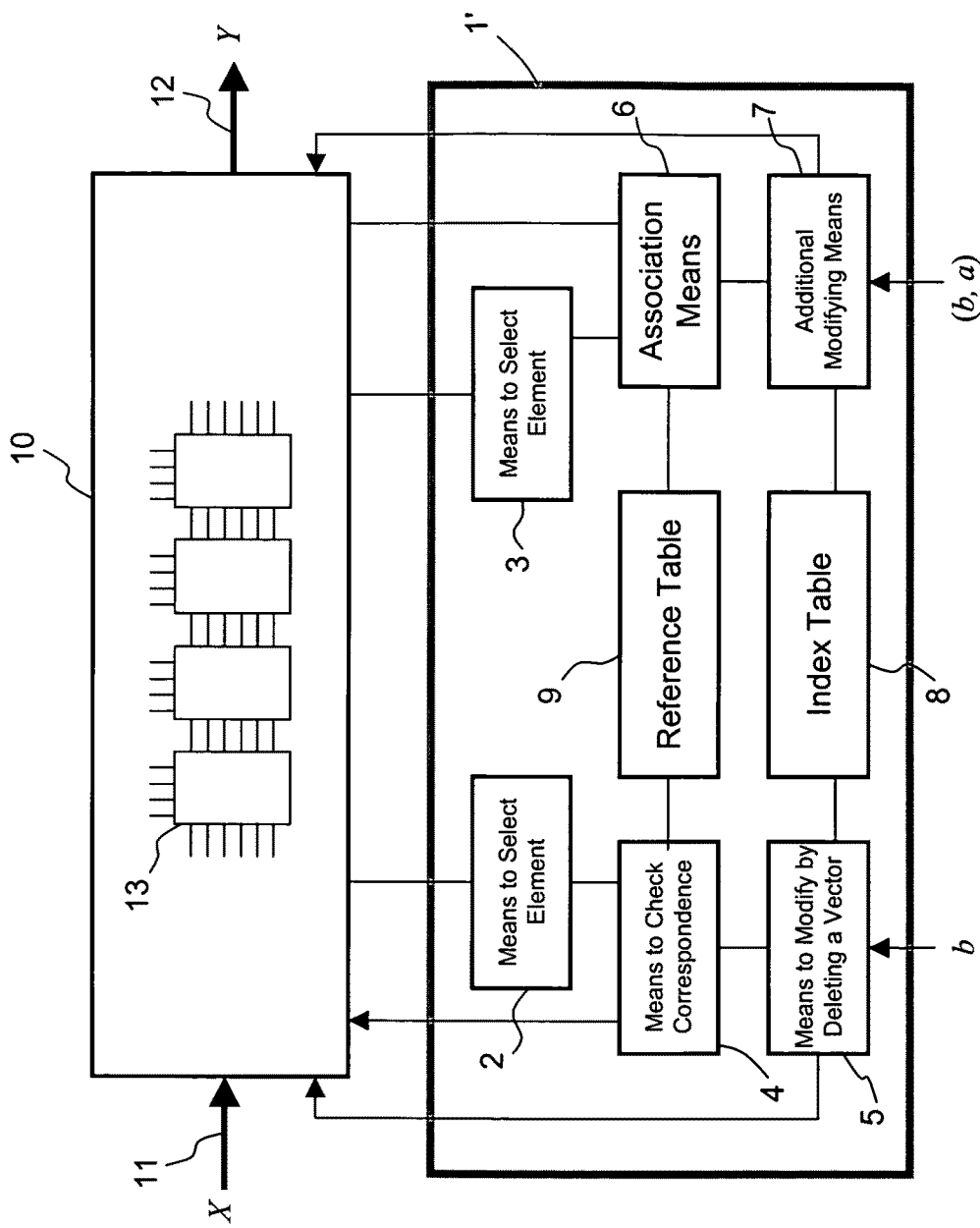
FIG. 12 shows the configuration of a reconfigurable multi-level logic network according to a fourth embodiment of the present invention.
Figure 15:
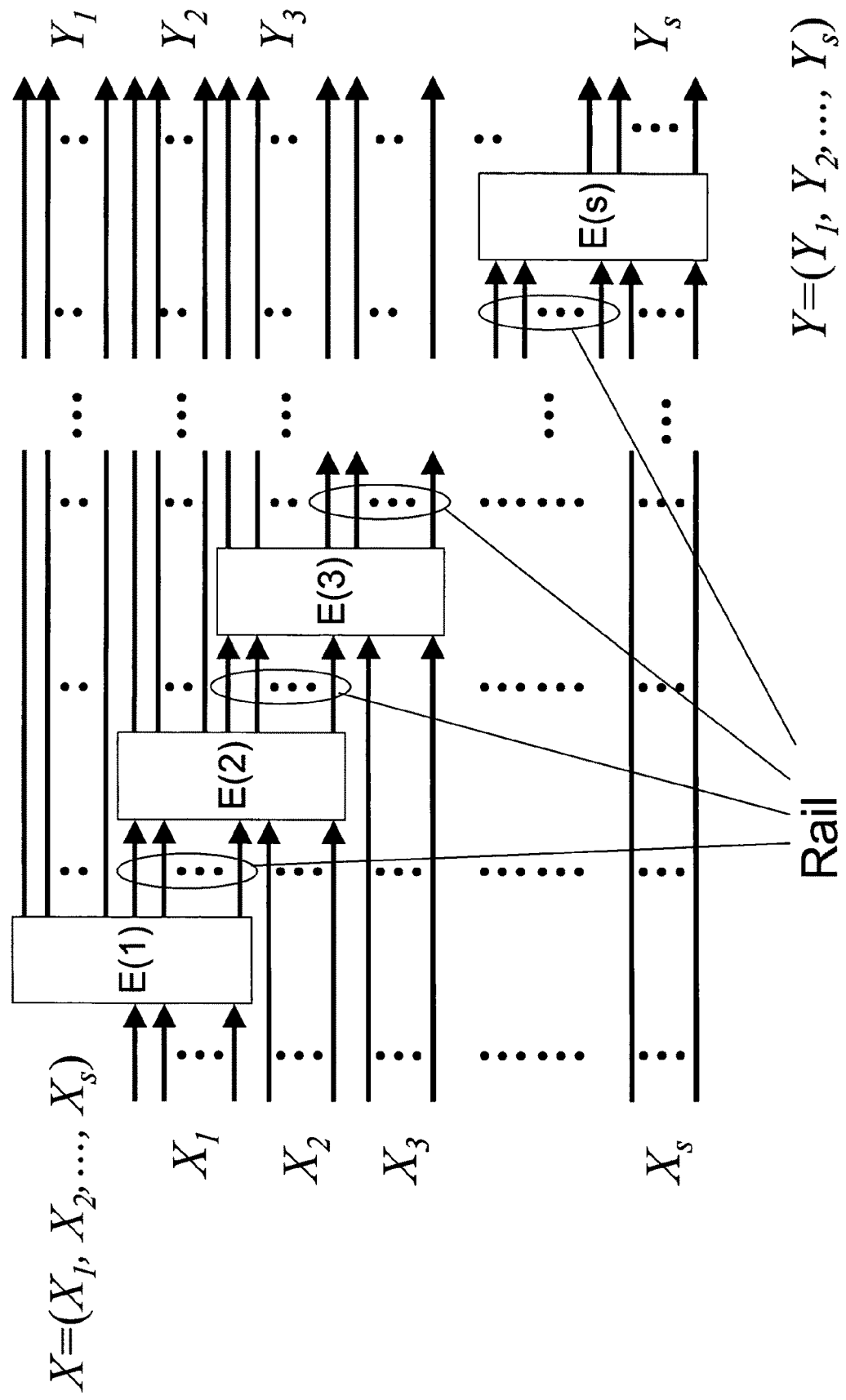
FIG. 15 shows a general LUT cascade logic circuit.

FIG. 12 shows the configuration of a reconfigurable multi-level logic network according to a fourth embodiment of the present invention. In FIG. 12, the same components as those of FIG. 15 are denoted by identical reference numerals.

In the reconfigurable multi-level logic network of this embodiment, a reconfiguration circuit 1' additionally includes an index table 8 and a reference table 9.

As described in the first embodiment, the multi-level logic network 10 is a logic circuit for operating an objective logic function F(X) with an input variable X. The multi-level logic network 10 is a logic circuit including plural pq elements 13 connected in multiple stages. To specifically describe the configuration of the multi-level logic network 10, the network may be configured using an LUT cascade logic circuit including plural cascaded pq elements 13 (see FIGS. 6 and 15) or an LUT tree logic circuit including plural tree-connected pq elements 13 (see FIGS. 2 to 4).

The reconfiguration circuit 1 reconfigures the multi-level logic network 10 following the logic modification of the multi-level logic network 10. The reconfiguration circuit 1 includes means to select element 2, means to select element 3, means to check correspondence 4, means to modify by deleting a vector 5, means for association 6, means to modify by adding a vector 7, the index table 8, and the reference table 9. Means to select element 2, means to select element 3, means to check correspondence 4, means to modify by deleting a vector 5, means to modify by adding a vector 7, and means for association 6 are the same as those of the first embodiment and thus not described here.

Here, the pq element 13 is not limited to a memory but may be any other circuit having a function similar to the memory.

For example, in FIG. 13, a 4-input LUT used in the Xilinx FPGA is used. The 4-input LUT includes 16 synchronous D-flip-flops 41_0 to 41_15 and one 16-input/1-output multiplexer 42.

This 4-input LUT can be used as a shift register by switching its mode and can be rewritten.

In FIG. 13(a), a mode is set to an SRL16 mode. In this mode, clocks are applied from clock line 43 to each of the DFFs 41_0 to 41_15. Thus, the DFFs 41_0 to 41_15 can function as a shift register. In this state, registration data is applied from a registered value input line 44 in a serial form to thereby store the registration data in the DFFs 41_0 to 41_15.

On the other hand, in FIG. 13(b), a mode is set to a 4-input LUT mode. In this mode, no clock is applied to the clock line 43, and this circuit functions as an LUT. If 4-bit data is applied from a data input line 45 to the MUX 42, the MUX 42 selects one of the DFFs 41_0 to 41_15 based on the input data and produces data stored in the selected DFF. Thus, the circuit functions as a 4-input/1-output LUT.

Figure 14:
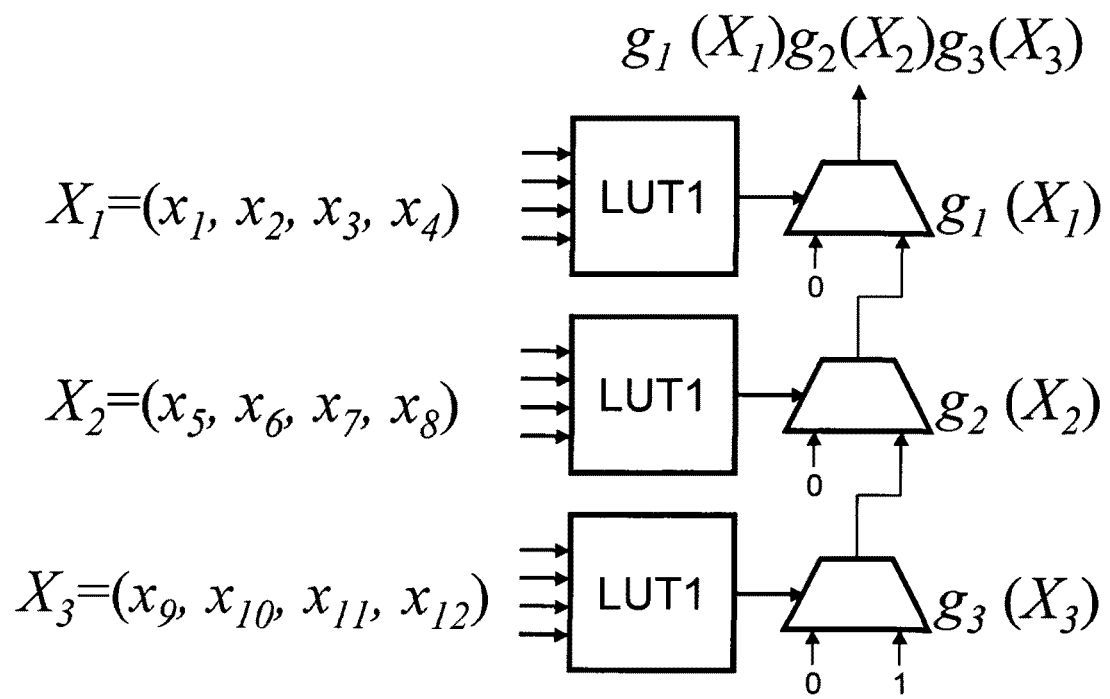
FIG. 14 shows a 12-input/1-output circuit using three 4-input LUTs.

FIG. 14 shows a 12-input/1-output circuit using three 4-input LUTs. As shown in FIG. 14, the circuit can operate AND of outputs of plural LUTs together with the multiplexer in the FPGA. Since this circuit is a 1-output circuit, output data of plural bits can be obtained by arranging as many circuits of FIG. 14 as a requisite number of bits, in parallel.

The LUT as shown in FIG. 13 may be used as the pq element 13.

The reference table 9 stores rail vectors being assigned to each pq element 13.

The term "rail" means a connection line connected to an input of a pq element in a subsequent stage out of output lines of a pq element in a previous stage in a multi-level logic network including plural pq element connected in multiple stages.

FIG. 15 shows a general LUT cascade logic circuit. Among the output lines of a pq element E(1) in FIG. 15, a line connected to an input of a pq element E(2) is "rail". Further, among the output lines of the pq element E(2), a line connected to an input of a pq element E(3) is "rail". The same applies to subsequent lines. The rails of the LUT tree logic circuits in FIGS. 2 to 4 are similarly defined.

The term "rail vector" means a vector of an output variable produced to a rail on the output side of a particular pq element.

FIG. 16 shows an example of the reference table 9. The reference table 9 is provided for each pq element of the multi-level logic network 10 in a one-to-one correspondence. The reference table 9 provided for one pq element lists rail vectors of the pq element and the number of referenced vectors corresponding thereto. Here, the term the "number of referenced vectors" means the number of registered vector referencing the rail vector.

The index table 8 stores information about whether a vector is being registered. In this example, only one index table 8 is provided. FIG. 17 shows an example of the index table. The index table 9 includes indexes assigned to each registerable vector and a corresponding registration flag indicating whether a registered vector is registered (used).

Registered vector addition/deletion operations of the thus-configured reconfigurable multi-level logic network of this embodiment will be described hereinbelow.

For ease of illustration, it is assumed that the LUT cascade logic circuit as shown in FIG. 6 is used as the multi-level logic network 10.

(1) Addition of Registered Vector

In the reconfigurable multi-level logic network of this embodiment, in the case of adding a new registered vector, the index table 8 and the reference table 9 are used to shorten processing time.

Figure 18:
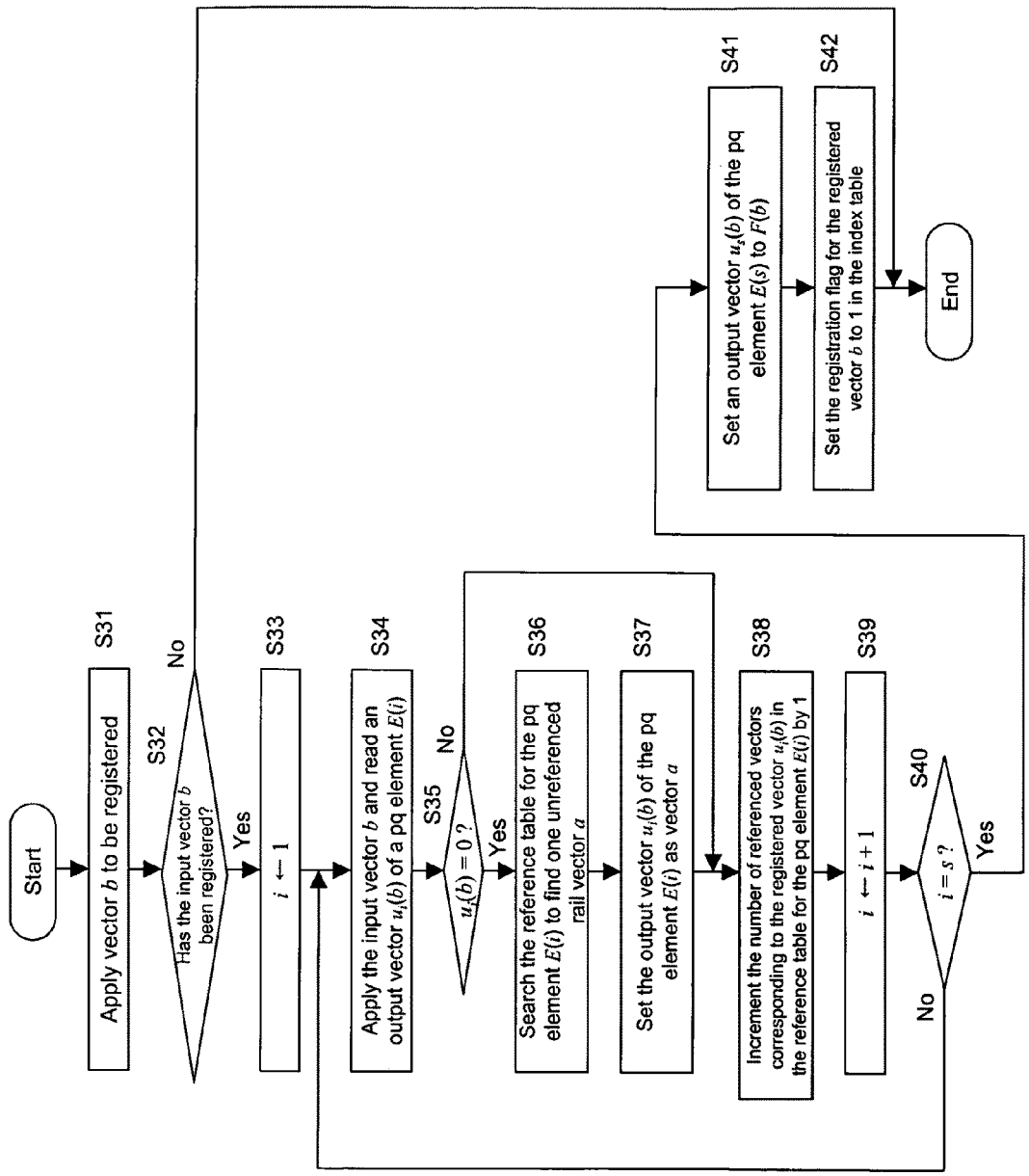
FIG. 18 is a flowchart of registered vector addition processing in a reconfigurable multi-level logic network of the fourth embodiment.

FIG. 18 is a flowchart showing registered vector addition processing in the reconfigurable multi-level logic network of the fourth embodiment.

First, in step S31, an input vector b to be registered is applied to the reconfiguration circuit 1'.

Next, in step S32, means to modify by adding a vector 7 references the index table 8 to check whether the input vector b has been registered in the multi-level logic network 10. If the registration flag is set to 1 for the input vector b in the index table 8, the processing is terminated.

Next, in step S33, means to select element 3 sets the index i indicating a number of a selected element to 1.

Next, in step S34, means for association 6 applies the input vector b to the multi-level logic network 10 and reads an output vector $u_i(b)$ of a pq element E(i).

Next, in step S35, means for association 6 determines whether the output vector $u_i(b)$ is 0. If the output vector is 0, the processing advances to step S38. If the output vector is not 0, the processing advances to the next step S36.

Next, in step S36, means for association 6 searches the reference table 9 for the pq element E(i) to find one unreferenced rail vector a. Then, in step S37, means to modify by adding a vector 7 rewrites a memory of the pq element E(i) so as to set the output vector $u_i(b)$ of the pq element E(i) as the rail vector a.

In step S38, means for association 6 increments the number of referenced vectors corresponding to the registered vector $u_1(b)$ in the reference table for the pq element E(i) by 1.

Next, in step S39, means to select element 3 increments the index i indicating a number of a selected element by 1.

Next, in step S40, means to select element 3 determines whether i=s. If i<s, the processing returns to step S34. If i=s, the processing advances to the next step S41.

In step S41, means to modify by adding a vector 7 rewrites a memory of a pq element E(s) to set an output vector $u_s(b)$ of the pq element E(s) to F(b).

Finally, in step S42, means to modify by adding a vector 7 sets the registration flag for the registered vector b to 1 in the index table 8 and terminates the registered vector addition processing.

(2) Deletion of Registered Vector

FIG. 19 is a flowchart showing registered vector deletion processing in the reconfigurable multi-level logic network of the fourth embodiment.

First, in step S51, an input vector b to be deleted is applied to the reconfiguration circuit 1'.

Next, in step S52, means to modify by deleting a vector 5 references the index table 8 to check whether the input vector b is being registered in the multi-level logic network 10. If a registration flag for the input vector b is set to 0 in the index table 8, the registered vector deletion processing is terminated.

Next, in step S53, means to select element 2 sets the index i indicating a number of a selected element to s.

Next, in step S54, means to check correspondence 4 applies the input vector b to the multi-level logic network 10 and reads an output vector $u_i(b)$ of the pq element E(i).

Next, in step S55, means to check correspondence 4 decrements the number of referenced vectors corresponding to the registered vector $u_i(b)$ in the reference table for the pq element E(i) by 1. However, if the number of referenced vectors corresponding to the registered vector $u_i(b)$ is 0, the number of referenced vectors corresponding to the registered vector $u_i(b)$ is kept 0.

Next, in step S56, means to modify by deleting a vector 5 determines whether the number of referenced vectors corresponding to the registered vector $u_i(b)$ is 0. If the number of referenced vectors corresponding to the registered vector $u_i(b)$ is not 0, the processing returns to step S58. If the number of referenced vectors is 0, the processing advances to the next step S57.

In step S57, means to modify by deleting a vector 5 rewrites a memory of the pq element E(i) so as to set an output vector $u_i(b)$ of the pq element E(i) to 0.

In step S58, means to select element 2 decrements the index i indicating a number of a selected element by 1.

Next, in step S59, means to select element 2 determines whether i=0. If i>0, the processing returns to step S54. If i=0, the processing advances to the next step S60.

In step S60, means to modify by deleting a vector 5 sets a registration flag for the registered vector b to 0 in the index table 8 and terminates the registered vector deletion processing.

The number of steps necessary to add one registered vector to the multi-level logic network 10 in the above processing can be estimated based on the following expression.

$$\text{Add}_{cas} = \text{Op.Cas} + s(\text{Op.Cas} + k \times \text{Acc.Mem} + \text{Acc.Mem}) \quad (13)$$

In this expression, OP.Cas represents the number of steps necessary to access the LUT cascade, Acc.Mem represents the number of steps necessary to access the reference table, s represents the number of cells, and k represents the number of registered vectors. The first term gives the estimated number of steps necessary to perform processing in steps S31 to S34 in the registered vector addition processing, and the second term gives the estimated number of steps necessary to perform the other processing.

Likewise, the number of steps necessary to delete one registered vector from the multi-level logic network 10 can be estimated based on the following expression.

$$\text{Del}_{cas} = \text{Op.Cas} + s(\text{Op.Cas} + \text{Acc.Mem}) \quad (14)$$

The first term gives the estimated number of steps necessary to perform processing in steps S51 to S54 in the registered vector deletion processing, and the second term gives the estimated number of steps necessary to perform the other processing.

As apparent from Expressions (13) and (14), if the multi-level logic network 10 is an LUT cascade logic circuit, the number of steps necessary to add a registered vector is almost proportional to s and k, and the number of steps necessary to delete a registered vector is almost proportional to s.

The invention claimed is:

1. A device to reconfigure multi-level logic networks, wherein a plurality of pq elements storing look-up tables (LUTs) of subfunctions obtained by the functional decomposition of an objective logic function F(X) with input variables X, are connected to form a network according to a connection relation among inputs and outputs of said subfunctions, due to a logic modification that modifies an output vector F(b) of said objective logic function F(X) for an input vector b to an "invalid value", comprising:

means to select an element that selects pq elements one-by-one from a pq element $E_G$ that is in a nearest place to an output terminal, among unmodified said plurality of pq elements;

means to check correspondence that checks whether the input vector corresponding to an output vector c exists other than said input vector b, wherein c denotes the output vector for said input vector b among output vectors of LUTs of said pq element $E_G$;

and means to modify by deleting a vector that changes the state of said pq element $E_G$ one-by-one as modified, and to rewrite the output vector c for said input vector b to the "invalid value", when said input vector b is the only vector that produces said output vector c in LUTs of the pq element $E_G$.

2. A device to reconfigure multi-level networks, wherein a plurality of pq elements storing look-up tables (LUTs) of subfunctions obtained by functional decomposition of an objective logic function F(X) with input variables X, are connected to form a network according to a connection relation among inputs and outputs of said subfunctions, due to a logic modification such that an output vector a for an input vector b is appended to a set of the output vectors of said objective logic function F(X), comprising:

means to select element that selects pq elements one-by-one from a pq element $E_G$ that is in a furthest place from an output terminal, among unmodified said plurality of pq elements;

means for association that changes a state of the pq element $E_G$ as modified, when the pq element $E_G$ is not in a nearest place to the output terminal, and that changes an output vector c to a vector value not used as an output vector of the pq element, when the output vector c for said input vector b is an "invalid value" among output vectors of LUTs of the pq element $E_G$;

and means to modify by adding a vector that rewrites the output vector c for said input vector b of LUTs of the pq element $E_0$ into the output vector a, and that changes the state of the pq element $E_G$ as modified, when said pq element $E_G$ is in the nearest place to the output terminal.

3. A device to modify logic networks, wherein an output vector $Q(b_i)$ of a main logic network for a specific object input vector $b_i$ is modified to a modification output vector $Q'(b_i)$, where $b_i$ is an input vector among input vectors b applied to input variables X, and said main logic network implements an objective logic function Q(X) of an input variable X, comprising:

an auxiliary memory that stores a vector for modification $P_i$ in a prescribed address $A_i$, to modify said output vector $Q(b_i)$ into said modification output vector $Q'(b_i)$ for said specific object input vector $b_i$;

means to modify that produces said modification output vector $Q'(b_i)$, according to the vector for modification $P_i$ and the output vector $Q(b_i)$ produced by said main logic network, when said auxiliary memory produces the vector for modification $P_i$;

and an address generation circuit that realizes an address generation function F(X), wherein F(X) produces the prescribed address $A_i$ for said auxiliary memory that stores said vector for modification $P_i$, when a value of the input variable X equals an object input vector $b_i$;

and wherein said address generation circuit is composed of multi-level logic networks, where a plurality of pq elements that store look-up tables (LUTs) of subfunctions obtained by a functional decomposition of said address generation function F(X), are connected to form a network according to a connection relation among inputs and outputs of subfunctions;

an exclusive OR of said vector for modification $P_i$ and said output vector $Q(b_i)$ of the main logic network for said object input vector $b_i$, is equal to said modification output vector $Q'(b_i)$;

said auxiliary memory produces said vector for modification $P_i$ to a means to modify, when the address $A_i$ produced by said address generation circuit is applied, and produces zero for other cases;

and said means to modify is an EXOR gates performing the exclusive OR operations between outputs of said auxiliary memory and outputs of said main logic network.

4. A device to modify logic networks, wherein an output vector $Q(b_i)$ of a main logic network for a specific object input vector $b_i$ is modified to a modification output vector $Q'(b_i)$, where $b_i$ is an input vector among input vectors b applied to input variables X, and said main logic network implements an objective logic function $Q(X)$ of an input variable X, comprising:

an auxiliary memory that stores a vector for modification $P_i$ in a prescribed address $A_i$, to modify said output vector $Q(b_i)$ into said modification output vector $Q'(b_i)$ for said specific object input vector $b_i$;

means to modify that produces said modification output vector $Q'(b_i)$, according to the vector for modification $P_i$ and the output vector $Q(b_i)$ produced by said main logic network, when said auxiliary memory produces the vector for modification $P_i$;

and an address generation circuit that realizes an address generation function $F(X)$, wherein $F(X)$ produces the address $A_i$ for said auxiliary memory that stores said vector for modification $P_i$, when a value of the input variable X equals said specific object input vector $b_i$;

and wherein said address generation circuit is composed of multi-level logic networks, where a plurality of pq elements that store look-up tables (LUTs) of subfunctions obtained by a functional decomposition of said address generation function $F(X)$, are connected to form a network according to a connection relation among inputs and outputs of subfunctions;

said auxiliary memory produces said vector for modification $P_i$ to a means to modify, when the address $A_i$ produced by said address generation circuit is applied;

said means to modify is a tri-state buffer connected in an output stage of said main logic network and said auxiliary memory;

said tri-state buffer in the output stage of said main logic network is in a high impedance state when an output value of said address generation circuit is not an "invalid value", and otherwise in a low impedance state;

and said tri-state buffer in an output stage of said auxiliary memory is in the high impedance state when the output value of said address generation circuit is the "invalid value", and otherwise in the low impedance state.

5. A device to modify logic networks as claimed in claim 3, wherein said auxiliary memory is a pq element in a final stage of said address generation circuit.

6. A device to modify logic networks as claimed in claim 3, further comprising:

a reconfiguration device to reconfigure said address generation circuit, due to a logic modification that modifies an output vector F(b) of said address generation function F(X) for an input vector b into an "invalid value" in said address generation circuit; wherein said reconfiguration device comprising:

means to select an element that selects pq elements one-by-one from a pq element $E_G$ that is in a nearest place to an output terminal, among unmodified said pq elements;

means to check correspondence that checks whether an input vector corresponding to an output vector c exists other than said input vector b, wherein the output vector c denotes an output vector for said input vector b, among output vectors of LUTs of said pq element $E_G$;

and means to modify by deleting a vector that changes a state of said pq element $E_G$ as modified, and that rewrites the output vector c for said input vector b to the "invalid value", when said input vector b is the only vector that produces said output vector c in the LUTs of the pq element $E_G$.

7. A device to modify logic networks as claimed in claim 3, further comprising:

a reconfiguration device to reconfigure said address generation circuit, due to a logic modification such that an output vector a for an input vector b is appended to a set of the output vectors of an objective logic function F(X) in the address generation circuit;

wherein said reconfiguration device comprising:

means to select an element that selects pq elements one-by-one from a pq element $E_G$ that is in a furthest place from a output terminal, among unmodified pq elements;

means for association that changes a state of the pq element $E_G$ as modified, when the pq element $E_G$ is not in a nearest place to the output terminal, and that changes an output vector c to a vector value not used as an output vector for the pq element, when the output vector c for an input vector b is an "invalid value" among output vectors of LUTs of the pq element $E_G$;

and means to modify by adding a vector that rewrites the output vector c for said input vector b of LUTs of the pq element $E_G$ into an output vector a, and that changes the state of the pq element $E_G$ as modified, when said pq element $E_G$ is in the nearest place to the output terminal.

8. A method to reconfigure multi-level logic networks, wherein a plurality of pq elements storing look-up tables (LUTs) of subfunctions obtained by a functional decomposition of an objective logic function F(X) with input variables X, are connected to form a network according to a connection relation among inputs and outputs of said subfunctions, due to a logic modification that modifies an output vector F(b) of said objective logic function F(X) for an input vector b into an "invalid value", comprising the steps of:

a selecting element step that selects pq elements one-by-one from a pq element $E_G$ that is in a nearest place to an output terminal, among unmodified said pq elements;

a checking correspondence step that checks whether an input vector corresponding to an output vector c exists other than said input vector b, wherein the output vector c denotes an output vector for said input vector b, among output vectors of LUTs of said pq element $E_G$;

and a modifying by deleting a vector step that changes a state of said pq element $E_G$ as modified, and that rewrites the output vector c for said input vector b to the "invalid value", when said input vector b is the only vector that produces said output vector c in the LUTs of the pq element $E_G$;

wherein, above the method to reconfigure multi-level logic networks is executed repeatedly.

9. A method to reconfigure multi-level logic networks, wherein a plurality of pq elements storing look-up tables (LUTs) of subfunctions obtained by a functional decomposition of an objective logic function F(X) with input variables X, are connected to form a network according to a connection relation among inputs and outputs of said subfunctions, due to a logic modification such that an output vector a for an input vector b is appended to a set of the output vectors of said objective logic function F(X), comprising the steps of:

a selecting element step that selects pq elements one-by-one from a pq element $E_G$ that is in a furthest place from an output terminal, among unmodified pq elements;

an associating step that changes a state of the pq element $E_G$ as modified, when the pq element $E_G$ is not in a nearest place to the output terminal, and that changes an output vector c to a vector value not used as an output vector of a pq element, when the output vector c for said input vector b is an "invalid value" among output vectors LUTs of the pq element $E_G$;

and a modifying by adding a vector step that rewrites the output vector c for said input vector b of LUTs of the pq element $E_G$ into an output vector a, and that changes the state of the pq element $E_G$, as modified, when said pq element $E_G$ is in the nearest place to the output terminal;

wherein, above the method to reconfigure multi-level logic networks is executed repeatedly.

10. A reconfigurable multi-level logic network wherein a plurality of pq elements storing look-up tables (LUTs) of subfunctions obtained by a functional decomposition of an objective logic function F(X) with input variables X, are connected to form a network according to a connection relation among inputs and outputs of said subfunctions, comprising:

a reconfiguration circuit that modifies said multi-level logic networks, due to a logic modification that modifies an output vector F(b) of said objective logic function F(X) for an input vector b into an "invalid value";

wherein said reconfiguration circuit comprising:

means to select an element that selects pq elements one-by-one from a pq element $E_G$ that is in a nearest place to an output terminal, among unmodified pq elements;

means to check correspondence that checks whether an input vector corresponding to an output vector c exists other than said input vector b, wherein input vector c denotes an output vector for said input vector b, among output vectors of LUTs of said pq element $E_G$;

and means to modify by deleting a vector that changes a state of said pq element $E_G$ as modified, and to rewrite the output vector c for said input vector b to the "invalid value", when said input vector b is in the only vector that produces said output vector c in LUTs of the pq element $E_G$.

11. A reconfigurable multi-level logic network wherein a plurality of pq elements storing look-up tables (LUTs) of subfunctions obtained by a functional decomposition of an objective logic function F(X) with input variables X, are connected to form a network according to a connection relation among inputs and outputs of said subfunctions, comprising:

a reconfiguration circuit that performs reconfiguration of said multi-level logic networks, due to a logic modification such that an output vector a for an input vector b is appended to a set of the output vectors of said objective logic function F(X);

wherein said reconfiguration circuit comprising:

means to select an element that selects pq elements one-by-one from a pq element $E_G$ that is in a furthest place from an output terminal, among unmodified pq elements;

means for association that changes a state of the pq element $E_G$ as modified, when the pq element $E_G$ is not in a nearest place to the output terminal, and that changes an output vector c to a vector value not used as an output vector of a pq element, when the output vector c for said input vector b is an "invalid value" among output vectors of LUTs of the pq element $E_G$;

and means to modify by adding a vector that rewrites the output vector c for said input vector b of LUTs of the pq element $E_G$ into the output vector a, and that changes the state of the pq element $E_G$ as modified, when said pq element $E_G$ is in the nearest place to the output terminal.

12. A device to modify logic network as claimed in claim 4, wherein said the auxiliary memory is a pq element in a final stage of said address generation circuit.

13. A device to modify logic networks as claimed in claim 4, further comprising:

a reconfiguration device to reconfigure said address generation circuit, due to a logic modification that modifies an output vector F(b) of said address generation function F(X) for an input vector b into the "invalid value" in said address generation circuit;

wherein said reconfiguration device comprising:

means to select an element that selects pq elements one-by-one from a pq element $E_G$ that is in a nearest place to an output terminal, among unmodified pq elements;

means to check correspondence that checks whether an input vector corresponding to an output vector c exists other than said input vector b, where wherein output vector c denotes the output vector for said input vector b, among output vectors of LUTs of said pq element $E_G$;

and means to modify by deleting a vector that changes a state of said pq element $E_G$ as modified, and that rewrites the output vector c for said input vector b to the "invalid value", when said input vector b is the only vector that produces said output vector c in LUTs of the pq element $E_G$.

14. A device to modify logic networks as claimed in claim 4, further comprising:

a reconfiguration device to reconfigure said address generation circuit, due to a logic modification such that an output vector a for an input vector b is appended to a set of the output vectors of said objective logic function F(X) in the address generation circuit;

wherein said reconfiguration device comprising:

means to select an element that selects pq elements one-by-one from a pq element $E_G$ that is in a furthest place from an output terminal, among unmodified pq elements;

means for association that changes a state of the pq element $E_G$ as modified, when the pq element $E_G$ is not in a nearest place to the output terminal, and that changes an output vector c to a vector value not used as an output vector of a pq element, when the output vector c for said input vector b is the "invalid value" among output vectors LUTs of the pq element $E_G$;

and means to modify by adding a vector that rewrites the output vector c for said input vector b of LUTs of the pq element $E_G$ into an output vector a, and that changes the state of the pq element $E_G$ as modified, when said pq element $E_G$ is in the nearest place to the output terminal.

* * * * *